US009660592B2

(12) United States Patent
Takase

(10) Patent No.: US 9,660,592 B2
(45) Date of Patent: May 23, 2017

(54) PSUEDO RESISTOR CIRCUIT AND CHARGE AMPLIFIER

(71) Applicant: Murata Manufacturing Co., Ltd., Nagaokakyo-shi, Kyoto-fu (JP)

(72) Inventor: Yasuhide Takase, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 63 days.

(21) Appl. No.: 14/870,651

(22) Filed: Sep. 30, 2015

(65) Prior Publication Data
US 2016/0020734 A1    Jan. 21, 2016

Related U.S. Application Data

(63) Continuation of application No. PCT/JP2014/058550, filed on Mar. 26, 2014.

(30) Foreign Application Priority Data

Apr. 2, 2013   (JP) ................................. 2013-076986

(51) Int. Cl.
G01R 29/24    (2006.01)
H03F 1/30     (2006.01)
(Continued)

(52) U.S. Cl.
CPC ............ H03F 1/301 (2013.01); G01R 29/24 (2013.01); H03F 3/70 (2013.01); H03K 17/6871 (2013.01); *H03F 2200/528* (2013.01)

(58) Field of Classification Search
CPC ...... H03F 1/301; G01R 29/24; H03K 17/6871
(Continued)

(56) References Cited

U.S. PATENT DOCUMENTS 5,943,000 A * 8/1999 Nessi .................. H03M 1/0602
                                                   341/145
6,002,354 A * 12/1999 Itoh ......................... H03M 1/68
                                                   341/144

(Continued)

FOREIGN PATENT DOCUMENTS

JP    H04-78825 U     7/1992
JP    H06-204793 A    7/1994

(Continued)

OTHER PUBLICATIONS

International Search Report issued for PCT/JP2014/058550, date of mailing Jun. 17, 2014.

(Continued)

*Primary Examiner* — Patricia T Nguyen
(74) *Attorney, Agent, or Firm* — Arent Fox LLP

(57) ABSTRACT

A pseudo resistor circuit and a charge amplifier include a first field effect transistor; a second field effect transistor having electrical characteristics matched with electrical characteristics of the first field effect transistor; and a voltage dividing circuit with terminal of a reference resistor electrically connected to a source terminal of the second field effect transistor. Further, a first operational amplifier with an output terminal is connected to a gate terminal of the first field effect transistor and a gate terminal of the second field effect transistor and in which midpoint voltage of the voltage dividing circuit is input into either an inverting or non-inverting input terminal and reference voltage is input into the other of the inverting and non-inverting input terminal. Furthermore, a second operational amplifier supplies voltage resulting from inversion and amplification of drain voltage of the first field effect transistor into the other terminal of the resistor.

20 Claims, 22 Drawing Sheets

(51) Int. Cl.
*H03F 3/70* (2006.01)
*H03K 17/687* (2006.01)

(58) Field of Classification Search
USPC .......................................................... 330/174
See application file for complete search history.

(56) References Cited

U.S. PATENT DOCUMENTS

| | | | | |
|---|---|---|---|---|
| 2004/0165719 | A1* | 8/2004 | Gregorius | H04L 25/0266 379/377 |
| 2004/0263241 | A1* | 12/2004 | Fujikura | G05F 3/262 327/543 |
| 2005/0033998 | A1* | 2/2005 | Honda | G06F 1/3228 713/300 |
| 2010/0123521 | A1* | 5/2010 | Bach | H03G 1/007 330/278 |
| 2010/0289521 | A1 | 11/2010 | Nakata | |
| 2014/0191768 | A1* | 7/2014 | Engl | G01R 35/005 324/601 |

FOREIGN PATENT DOCUMENTS

| | | |
|---|---|---|
| JP | H09-61478 A | 3/1997 |
| JP | H09-93053 A | 4/1997 |
| JP | 2005-234781 A | 9/2005 |
| JP | 2007-148530 A | 6/2007 |
| JP | 2008-224230 A | 9/2008 |
| JP | 2010-268350 A | 11/2010 |
| WO | WO 95/25349 A1 | 9/1995 |

OTHER PUBLICATIONS

Written Opinion of the International Searching Authority issued for PCT/JP2014/058550, date of mailing Jun. 17, 2014.

* cited by examiner

PSUEDO RESISTOR CIRCUIT AND CHARGE AMPLIFIER

CROSS REFERENCE TO RELATED APPLICATIONS

The present application is a continuation of PCT/JP2014/058550 filed Mar. 26, 2014, which claims priority to Japanese Patent Application No. 2013-076986, filed Apr. 2, 2013, the entire contents of each of which are incorporated herein by reference.

FIELD OF THE INVENTION

The present invention relates to pseudo resistor circuits and charge amplifiers. In particular, the present invention relates to a pseudo resistor circuit including a metal oxide semiconductor field effect transistor (MOSFET) used in a weak inversion region and a charge amplifier using the pseudo resistor circuit.

BACKGROUND OF THE INVENTION

Charge output sensors have been in widespread use in recent years. The charge output sensors are electric charge generating sensors, such as strain gauges and acceleration sensors, using piezoelectric elements made of insulating material. Since minor electric charge is detected in such a charge output sensor, it is necessary to provide an amplifier circuit for amplifying a signal detected by the charge output sensor.

In addition, resistors having resistance values of the order of gigaohms are required in semiconductor devices with increase in function and integration in recent years.

In such situations, Patent Document 1 relates to a detection apparatus, a sensor, and an electronic device and discloses an amplifier circuit including an operational amplifier, a resistor, and a capacitor. A non-inverting input terminal of the operational amplifier is grounded. The resistor and the capacitor are electrically connected in parallel between an output terminal and an inverting input terminal of the operational amplifier.

Patent Document 2 relates to a gigaohm-load resistor for a micro-electronic integrated circuit and discloses production of a high-resistance element by using a MOSFET in the weak inversion region.

Patent Document 1: Japanese Unexamined Patent Application Publication No. 2008-224230.

Patent Document 2: International Publication No. 95/25349.

However, a review by the inventor indicates that, in the charge amplifier, the frequency range of the detection signal from the charge output sensor frequently reaches a low-frequency domain and, in such a case, it is necessary to mount a high-resistance element of at least several tens megaohms in order to reduce the cutoff frequency determined by the resistance value of the resistor (feedback resistance) and the capacitance of the capacitor (feedback capacitance).

In the configuration disclosed in Patent Document 1, the mounting of the high-resistance element of several tens megaohms or larger increases the size of the entire circuit configuration. No disclosure and no suggestion are provided about specific configurations to reduce the size of the circuit and to increase the integration.

In the configuration disclosed in Patent Document 2, although the production of the high-resistance element by using a MOSFET in the weak inversion region is disclosed, no disclosure and no suggestion are provided about specific configurations indicating how the high-resistance element is applied to the charge amplifier.

The review by the inventor also indicates that the resistance value of the MOSFET in the weak inversion region of the MOSFET is very sensitive to a variation in a series of manufacturing processes of the MOSFET and a change in power supply voltage and temperature because the resistance value of the MOSFET is exponentially varied depending on the capacity of the oxide film of the MOSFET and factors including threshold voltage and the temperature. In addition, the resistance value of the MOSFET in the weak inversion region is also exponentially varied depending on not only the variation in the gate voltage but also the variation in the drain voltage and the source voltage.

Accordingly, when the MOSFET is activated in the weak inversion region and is applied to the charge amplifier as a pseudo resistor, it is necessary to separately provide an adjustment circuit of the gate voltage in order to adjust the resistance value, that is, a pseudo resistance value of the MOSFET and the pseudo resistance value is also varied when the drain-source voltage of the MOSFET is varied. Consequently, non-linearity as the resistor is strong and waveform distortion may occur in the signal output from the MOSFET with the variation in the power supply voltage and so on.

SUMMARY OF THE INVENTION

In other words, a pseudo resistor circuit having a new configuration and a charge amplifier using the pseudo resistor circuit are expected under the present conditions. The pseudo resistor circuit eliminates the necessity to provide an additional adjustment circuit for adjusting the pseudo resistance value of the field effect transistor depending on the variation in the manufacturing processes and the change in power supply voltage and temperature and is capable of reducing the waveform distortion caused by the variation in the power supply voltage of the field effect transistor.

In order to resolve the above problems, it is an object of the present invention to provide a pseudo resistor circuit that eliminates the necessity to provide an additional adjustment circuit for adjusting the pseudo resistance value of the field effect transistor and that is capable of reducing the waveform distortion caused by the variation in the power supply voltage of the field effect transistor and a charge amplifier using the pseudo resistor circuit.

In order to achieve the above object, in a first aspect, the present invention provides a pseudo resistor circuit including a first field effect transistor; a second field effect transistor having electrical characteristics matched with electrical characteristics of the first field effect transistor; a voltage dividing circuit in which one terminal of a reference resistor is electrically connected to a source terminal of the second field effect transistor; a first operational amplifier which includes an inverting input terminal, a non-inverting input terminal, and an output terminal electrically connected to a gate terminal of the first field effect transistor and a gate terminal of the second field effect transistor and in which midpoint voltage of the voltage dividing circuit is input into one of the inverting input terminal and the non-inverting input terminal and reference voltage is input into the other of the inverting input terminal and the non-inverting input terminal; and a second operational amplifier that supplies voltage resulting from inversion and amplification of drain voltage of a drain terminal of the first field effect transistor electrically connected to a drain terminal of the second field effect transistor into the other terminal of the reference resistor.

In the above configuration in the first aspect, negative feedback performed by the first operational amplifier, which includes the inverting input terminal, the non-inverting input terminal, and the output terminal electrically connected to the gate terminal of the first field effect transistor and the gate terminal of the second field effect transistor and in which the midpoint voltage of the voltage dividing circuit is input into one of the inverting input terminal and the non-inverting input terminal and the reference voltage is input into the other of the inverting input terminal and the non-inverting input terminal, causes the pseudo resistance value of the first field effect transistor to be stabilized to a constant value.

In a second aspect of the present invention, in addition to the first aspect, the pseudo resistor circuit further includes an absolute value circuit that supplies absolute value voltage of the drain voltage of the first field effect transistor to an input-side terminal of the second operational amplifier and the drain terminal of the second field effect transistor.

In the above configuration of the second aspect, since the absolute value circuit that supplies the absolute value voltage of the drain voltage of the first field effect transistor to the input-side terminal of the second operational amplifier and the drain terminal of the second field effect transistor is provided, the drain voltage of the first field effect transistor is converted into the absolute value voltage. Accordingly, since the voltage of the positive value is applied to the drain terminal of the second field effect transistor and the input-side terminal of the second operational amplifier, the pseudo resistance value of the first field effect transistor is stably kept at the constant value.

In a third aspect of the present invention, in addition to the first aspect, the pseudo resistor circuit further includes a first voltage source provided between the drain terminal of the second field effect transistor electrically connected to the input-side terminal of the second operational amplifier and the drain terminal of the first field effect transistor.

In the above configuration of the third aspect, since the first voltage source of certain voltage is provided between the drain terminal of the second field effect transistor electrically connected to the input-side terminal of the second operational amplifier and the drain terminal of the first field effect transistor, the voltages of the drain terminal of the second field effect transistor and the input-side terminal of the second operational amplifier are kept at the certain value.

In a fourth aspect of the present invention, in addition to the third aspect, the first voltage source is a floating voltage source including a PTAT current source and a resistor.

In the above configuration of the fourth aspect, since the first voltage source is the floating voltage source including the PTAT current source and the resistor, the amount of variation caused by the variation in thermal voltage concerning the drain voltage in the pseudo resistance value of the first field effect transistor is offset to allow the pseudo resistance value of the first field effect transistor to be adjusted and to reduce the temperature dependence.

In a fifth aspect of the present invention, in addition to any of the first to fourth aspects, the pseudo resistor circuit further includes a second voltage source provided on electrical wiring that electrically connects the gate terminal of the first field effect transistor to the gate terminal of the second field effect transistor.

In the above configuration of the fifth aspect, since the second voltage source of certain voltage is provided on the electrical wiring that electrically connects the gate terminal of the first field effect transistor to the gate terminal of the second field effect transistor, the gate voltage of the first field effect transistor is typically adjusted so as to be decreased using the voltage of the second voltage source and the pseudo resistance value of the first field effect transistor is typically adjusted to a higher value.

In a sixth aspect of the present invention, in addition to the fifth aspect, the second voltage source is a floating voltage source including a PTAT current source and a resistor.

In the above configuration of the sixth aspect, since the floating voltage source is provided on the electrical wiring that electrically connects the gate terminal of the first field effect transistor to the gate terminal of the second field effect transistor, the gate voltage of the first field effect transistor is adjusted using the output voltage proportional to the temperature of the floating voltage source and the amount of variation caused by the variation in thermal voltage concerning the gate voltage in the pseudo resistance value of the first field effect transistor is offset to allow the pseudo resistance value of the first field effect transistor to be adjusted and to reduce the temperature dependence.

In a seventh aspect, the present invention provides a charge amplifier including the pseudo resistor circuit described in any of the first to sixth aspects; a third operational amplifier including an inverting input terminal electrically connected to a source terminal of the first field effect transistor, a non-inverting input terminal to which the reference voltage is supplied, and an output terminal electrically connected to the drain terminal of the first field effect transistor; and a capacitor electrically connected between the inverting input terminal of the third operational amplifier and the output terminal of the third operational amplifier and between the source terminal of the first field effect transistor and the drain terminal of the first field effect transistor.

In the above configuration of the seventh aspect, the waveform distortion caused by the non-linearity of the pseudo resistor circuit is reduced in the output signal from the charge amplifier in association with the operation of the pseudo resistor circuit described in any of the first to sixth aspects. In addition, since the first field effect transistor has a relatively high pseudo resistance value, the detection signal in a low-frequency domain, which is output from a charge output sensor, is also reliably amplified by the third operational amplifier and is output from the charge amplifier.

The pseudo resistor circuit in the first aspect of the present invention includes the first field effect transistor; the second field effect transistor having electrical characteristics matched with electrical characteristics of the first field effect transistor; the voltage dividing circuit in which one terminal of the reference resistor is electrically connected to the source terminal of the second field effect transistor; the first operational amplifier which includes the inverting input terminal, the non-inverting input terminal, and the output terminal electrically connected to the gate terminal of the first field effect transistor and the gate terminal of the second field effect transistor and in which the midpoint voltage of the voltage dividing circuit is input into one of the inverting input terminal and the non-inverting input terminal and the reference voltage is input into the other of the inverting input terminal and the non-inverting input terminal; and the second operational amplifier that supplies the voltage resulting from inversion and amplification of the drain voltage of the drain terminal of the first field effect transistor electrically connected to the drain terminal of the second field effect transistor into the other terminal of the reference resistor.

Accordingly, it is possible to eliminate the necessity to provide an additional adjustment circuit for adjusting the pseudo resistance value of the field effect transistor and to stabilize the pseudo resistance value of the first field effect transistor to the constant value.

The pseudo resistor circuit in the second aspect of the present invention further includes the absolute value circuit that supplies the absolute value voltage of the drain voltage of the first field effect transistor to the input-side terminal of the second operational amplifier and the drain terminal of the second field effect transistor. Accordingly, it is possible to convert the drain voltage of the first field effect transistor into the absolute value voltage. Consequently, the voltage of the positive value is capable of being applied to the drain terminal of the second field effect transistor and the input-side terminal of the second operational amplifier to allow the pseudo resistance value of the first field effect transistor to be stably kept at the constant value.

The pseudo resistor circuit in the third aspect of the present invention further includes the first voltage source of certain voltage provided between the drain terminal of the second field effect transistor electrically connected to the input-side terminal of the second operational amplifier and the drain terminal of the first field effect transistor. Accordingly, it is possible to keep the voltages of the drain terminal of the second field effect transistor and the input-side terminal of the second operational amplifier at the certain value.

According to the pseudo resistor circuit in the fourth aspect of the present invention, the first voltage source is the floating voltage source including the PTAT current source and the resistor. Accordingly, the amount of variation caused by the variation in thermal voltage concerning the drain voltage in the pseudo resistance value of the first field effect transistor is offset to allow the pseudo resistance value of the first field effect transistor to be adjusted and to reduce the temperature dependence.

The pseudo resistor circuit in the fifth aspect of the present invention further includes the second voltage source, typically, a direct-current voltage source of certain voltage, which is provided on the electrical wiring that electrically connects the gate terminal of the first field effect transistor to the gate terminal of the second field effect transistor. Accordingly, it is possible to adjust the gate voltage of the first field effect transistor so as to be typically decreased using the voltage of the direct-current voltage source. Consequently, the pseudo resistance value of the first field effect transistor is capable of being typically adjusted to a higher value.

The pseudo resistor circuit in the sixth aspect of the present invention further includes the floating voltage source provided on the electrical wiring that electrically connects the gate terminal of the first field effect transistor to the gate terminal of the second field effect transistor. Accordingly, it is possible to adjust the gate voltage of the first field effect transistor using the output voltage proportional to the temperature of the floating voltage source. Consequently, the amount of variation caused by the variation in thermal voltage concerning the gate voltage in the pseudo resistance value of the first field effect transistor is offset to allow the pseudo resistance value of the first field effect transistor to be adjusted and to reduce the temperature dependence.

The charge amplifier in the seventh aspect of the present invention includes the pseudo resistor circuit described in any of the first to sixth aspects; the third operational amplifier including the inverting input terminal electrically connected to the source terminal of the first field effect transistor, the non-inverting input terminal to which the reference voltage is supplied, and the output terminal electrically connected to the drain terminal of the first field effect transistor; and the capacitor electrically connected between the inverting input terminal of the third operational amplifier and the output terminal of the third operational amplifier and between the source terminal of the first field effect transistor and the drain terminal of the first field effect transistor. Accordingly, it is possible to generate the output signal from the charge amplifier, in which the waveform distortion caused by the non-linearity of the pseudo resistance value is reduced in association with the effect of the pseudo resistor circuit described in any of the first to fourth aspects. In addition, the first field effect transistor has a relatively high pseudo resistance value, the detection signal in the low-frequency domain, which is output from the charge output sensor, is also reliably amplified by the third operational amplifier and is output from the charge amplifier. Furthermore, the integration is easily achieved in the charge amplifier including the pseudo resistor circuit.

DETAILED DESCRIPTION OF EMBODIMENTS

Pseudo resistor circuits in embodiments of the present invention and charge amplifiers using the pseudo resistor circuits will herein be described in detail with appropriate reference to the attached drawings.

First Embodiment

First, a pseudo resistor circuit in a first embodiment of the present invention and a charge amplifier using the pseudo resistor circuit will be described in detail with reference to FIG. 1 and FIG. 2.

Figure 1:
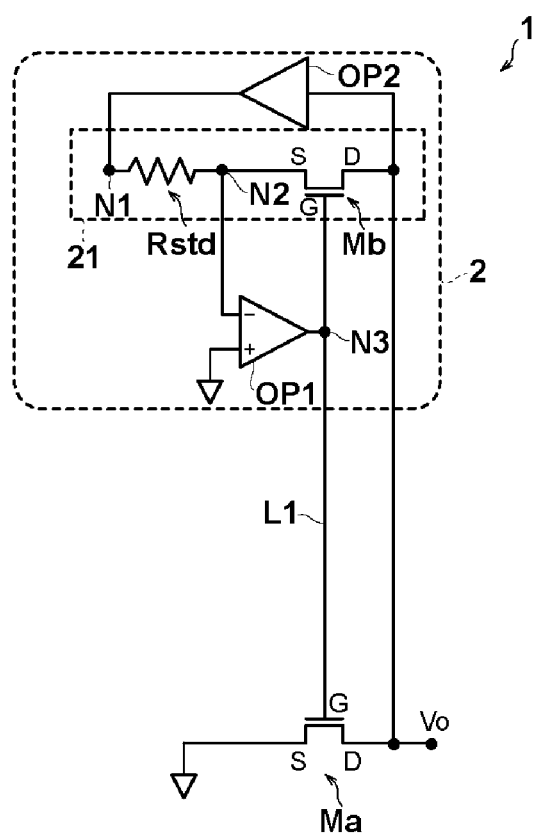
FIG. 1 is a circuit diagram illustrating a configuration of a pseudo resistor circuit in a first embodiment of the present invention.

FIG. 1 is a circuit diagram illustrating a configuration of the pseudo resistor circuit in the present embodiment. FIG. 2 is a circuit diagram illustrating a configuration of the charge amplifier to which the pseudo resistor circuit in the present embodiment is applied.

[Configuration of Pseudo Resistor Circuit]

The configuration of a pseudo resistor circuit 1 in the present embodiment will be described in detail with reference to FIG. 1.

As illustrated in FIG. 1, the pseudo resistor circuit 1 in the present embodiment includes a first field effect transistor Ma and a distortion compensation bias source 2 that reduces waveform distortion caused by a variation in resistance value of the first field effect transistor Ma.

The first field effect transistor Ma is typically a MOSFET and is composed of an n-type MOSFET. The first field effect transistor Ma is activated in the weak inversion region to function as a pseudo resistor. In other words, the resistance value of the first field effect transistor Ma is a pseudo resistance value in the weak inversion region.

A source terminal S of the first field effect transistor Ma is electrically connected to a reference voltage terminal, such as a ground terminal, which supplies reference voltage. A drain terminal D of the first field effect transistor Ma is a terminal the voltage of which is drain voltage Vo. The drain terminal D of the first field effect transistor Ma is electrically connected to a drain terminal D of a second field effect transistor Mb and an input-side terminal of a second operational amplifier OP2 in the distortion compensation bias source 2 described in detail below. A gate terminal G of the first field effect transistor Ma is electrically connected to an output terminal of a first operational amplifier OP1 and a gate terminal G of the second field effect transistor Mb in the distortion compensation bias source 2 described in detail below.

The distortion compensation bias source 2 includes a voltage dividing circuit 21, the second field effect transistor Mb, the first operational amplifier OP1, and the second operational amplifier OP2.

The voltage dividing circuit 21 is composed of a circuit in which a reference resistor Rstd is electrically connected to the second field effect transistor Mb. One terminal of the reference resistor Rstd is electrically connected to a source terminal S of the second field effect transistor Mb and the other terminal of the reference resistor Rstd is electrically connected to an output-side terminal of the second operational amplifier OP2.

Electrical characteristics of the second field effect transistor Mb are matched with electrical characteristics of the first field effect transistor Ma. Specifically, in the present embodiment, the second field effect transistor Mb is typically manufactured on the same wafer as that of the first field effect transistor Ma through the same series of processes as those of the first field effect transistor Ma as the transistor having the same physical configuration as that of the first field effect transistor Ma. In other words, the second field effect transistor Mb has the same polarity as that of the first field effect transistor, is typically a MOSFET, and is composed of an n-type MOSFET. The second field effect transistor Mb is activated in the weak inversion region, as in the first field effect transistor Ma, and the resistance value of the second field effect transistor Mb is the pseudo resistance value in the weak inversion region.

The source terminal S of the second field effect transistor Mb is electrically connected to the one terminal of the reference resistor Rstd. The drain terminal D of the second field effect transistor Mb is electrically connected to the input-side terminal of the second operational amplifier OP2. The gate terminal G of the second field effect transistor Mb is electrically connected to the output terminal of the first operational amplifier OP1 and the gate terminal G of the first field effect transistor Ma.

The first operational amplifier OP1 includes an inverting input terminal (−), a non-inverting input terminal (+), and an output terminal.

The inverting input terminal (−) of the first operational amplifier OP1 is electrically connected between the one terminal of the reference resistor Rstd and the source terminal S of the second field effect transistor Mb, that is, to midpoint voltage of the voltage dividing circuit 21. The non-inverting input terminal (+) of the first operational amplifier OP1 is electrically connected to the reference voltage terminal, such as the ground terminal, which supplies certain reference voltage. The output terminal of the first operational amplifier OP1 is electrically connected to the gate terminal G of the first field effect transistor Ma and the gate terminal G of the second field effect transistor Mb.

The second operational amplifier OP2 has a function to invert and amplify the voltage input into the second operational amplifier OP2 and amplifies the input voltage at a certain negative amplification factor, such as −1 time. The configuration of electrical connection between the terminals of the second operational amplifier OP2 is not illustrated in detail in the drawings and the terminals are simply denoted by the input-side terminal and the output-side terminal.

The drain terminal D of the first field effect transistor Ma and the drain terminal D of the second field effect transistor Mb are electrically connected to the input-side terminal of the second operational amplifier OP2 to apply the drain voltage Vo to the input-side terminal of the second operational amplifier OP2. The output-side terminal of the second operational amplifier OP2 is electrically connected to the other terminal of the reference resistor Rstd.

In the drawings, a portion on electrical wiring that electrically connects the other terminal of the reference resistor Rstd to the output-side terminal of the second operational amplifier OP2 is denoted by a node N1. A portion on electrical wiring that electrically connects the one terminal of the reference resistor Rstd to the source terminal S of the second field effect transistor Mb and the inverting input terminal (−) of the first operational amplifier OP1 is denoted by a node N2. The voltage at the node N2 is the midpoint voltage of the voltage dividing circuit 21. A portion on electrical wiring L1 that electrically connects the gate terminal G of the first field effect transistor Ma to the output terminal of the first operational amplifier OP1 and the gate terminal G of the second field effect transistor Mb is denoted by a node N3.

[Operation of Pseudo Resistor Circuit]

Next, an operation of the pseudo resistor circuit 1 having the above configuration will be described in detail.

The operation of the pseudo resistor circuit 1 having the above configuration will now be considered in a case in which the non-inverting input terminal (+) of the first operational amplifier OP1 is electrically connected to the reference voltage terminal, such as the ground terminal; the amplification factor of the second operational amplifier OP2 is a negative factor, such as −1 time; the drain voltage Vo of the first field effect transistor Ma has a positive value; and the voltage at the gate terminal G of the first field effect transistor Ma and the voltage at the gate terminal G of the second field effect transistor Mb are higher than a certain value, that is, the pseudo resistance values of the first field effect transistor Ma and the second field effect transistor Mb are lower than the certain value.

Under the above conditions, positive voltage is input into the inverting input terminal (−) of the first operational amplifier OP1 in association with the voltage at the node N2, which has a value smaller than the drain voltage Vo but has a positive value. Accordingly, the voltage at the node N3 is decreased in response to the decrease in the output voltage from the first operational amplifier OP1, the gate voltage of the second field effect transistor Mb is decreased, and the pseudo resistance value of the second field effect transistor Mb is increased. As a result, the voltage at the node N2 is decreased.

In addition, negative feedback is continuously caused by the first operational amplifier OP1 to stabilize the voltage at the node N2 to the reference voltage. As a result, the stabilization of the output voltage from the first operational amplifier OP1 stabilizes the voltage at the node N3 and the gate voltage of the first field effect transistor Ma is stabilized to a constant value.

In other words, the negative feedback operation of the first operational amplifier OP1 causes the pseudo resistance value of the first field effect transistor Ma to be gradually increased and be finally stabilized to the constant value. Also when the voltage at the gate terminal G of the first field effect transistor Ma and the voltage at the gate terminal G of the second field effect transistor Mb are lower than the certain value, that is, the pseudo resistance values of the first field effect transistor Ma and the second field effect transistor Mb are higher than the certain value, the pseudo resistance value of the first field effect transistor Ma is finally stabilized to the constant value.

Accordingly, in the pseudo resistor circuit 1 having the above configuration, the pseudo resistance value of the first field effect transistor Ma is stably kept at the constant value.

[Configuration and Operation of Charge Amplifier]

Next, the configuration and an operation of a charge amplifier 100 to which the pseudo resistor circuit 1 having the above configuration is applied will be described in detail with reference to FIG. 2.

Figure 2:
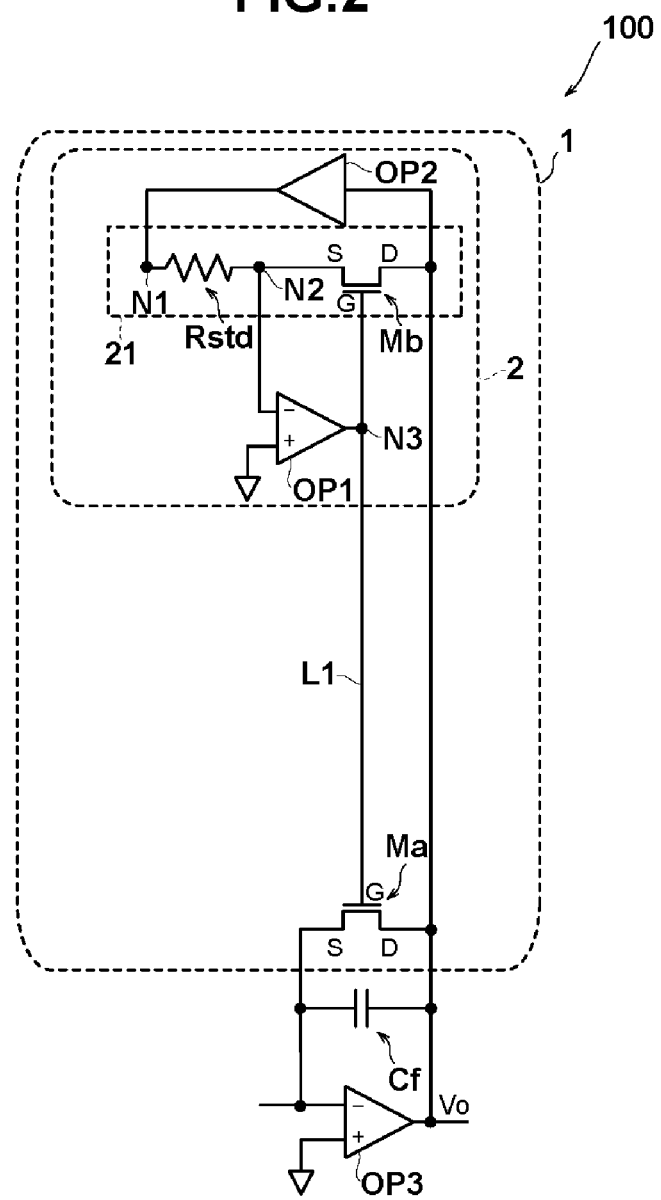
FIG. 2 is a circuit diagram illustrating a configuration of a charge amplifier to which the pseudo resistor circuit in the present embodiment is applied.

As illustrated in FIG. 2, the charge amplifier 100 includes the pseudo resistor circuit 1, a third operational amplifier OP3, and a capacitor Cf.

A non-inverting input terminal (+) of the third operational amplifier OP3 is electrically connected to the reference voltage terminal, such as the ground terminal. An inverting input terminal (−) of the third operational amplifier OP3 is electrically connected to the source terminal S of the first field effect transistor Ma. An output terminal of the third operational amplifier OP3 is electrically connected to the drain terminal D of the first field effect transistor Ma. The capacitor Cf is electrically connected in parallel between the output terminal and the inverting input terminal (−) of the third operational amplifier OP3 and between the source terminal S and the drain terminal D of the first field effect transistor Ma.

In the charge amplifier 100 having the above configuration, the detection signal from the charge output sensor (not illustrated) is input into the inverting input terminal (−) of the third operational amplifier OP3 and is output as an amplified signal.

At this time, since the pseudo resistance value of the first field effect transistor Ma is stabilized to the constant value in the pseudo resistor circuit 1, the waveform distortion caused by the non-linearity of the pseudo resistance value is reduced in the output signal from the charge amplifier 100, which is output from the inverting input terminal (−) of the third operational amplifier OP3. In addition, since the first field effect transistor Ma has a relatively high pseudo resistance value, the detection signal in a low-frequency domain, which is output from the charge output sensor, is also reliably amplified by the third operational amplifier OP3 and is output from the charge amplifier 100. Furthermore, the integration is easily achieved in the charge amplifier 100 including the pseudo resistor circuit 1.

Second Embodiment

Next, a pseudo resistor circuit in a second embodiment of the present invention and a charge amplifier using the pseudo resistor circuit will be described in detail with reference to FIG. 3 and FIG. 4.

Figure 3:
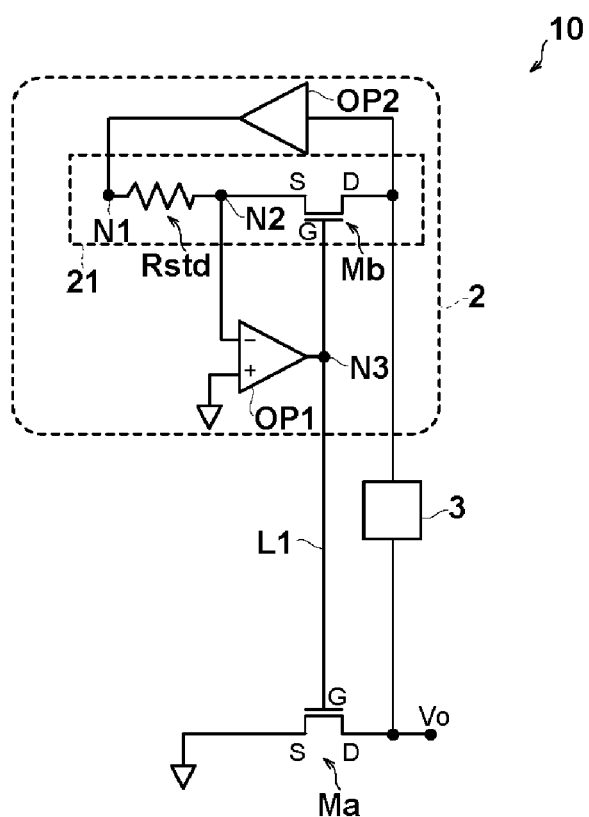
FIG. 3 is a circuit diagram illustrating a configuration of a pseudo resistor circuit in a second embodiment of the present invention.

FIG. 3 is a circuit diagram illustrating a configuration of the pseudo resistor circuit in the present embodiment. FIG. 4 is a circuit diagram illustrating a configuration of the charge amplifier to which the pseudo resistor circuit in the present embodiment is applied.

Figure 4:
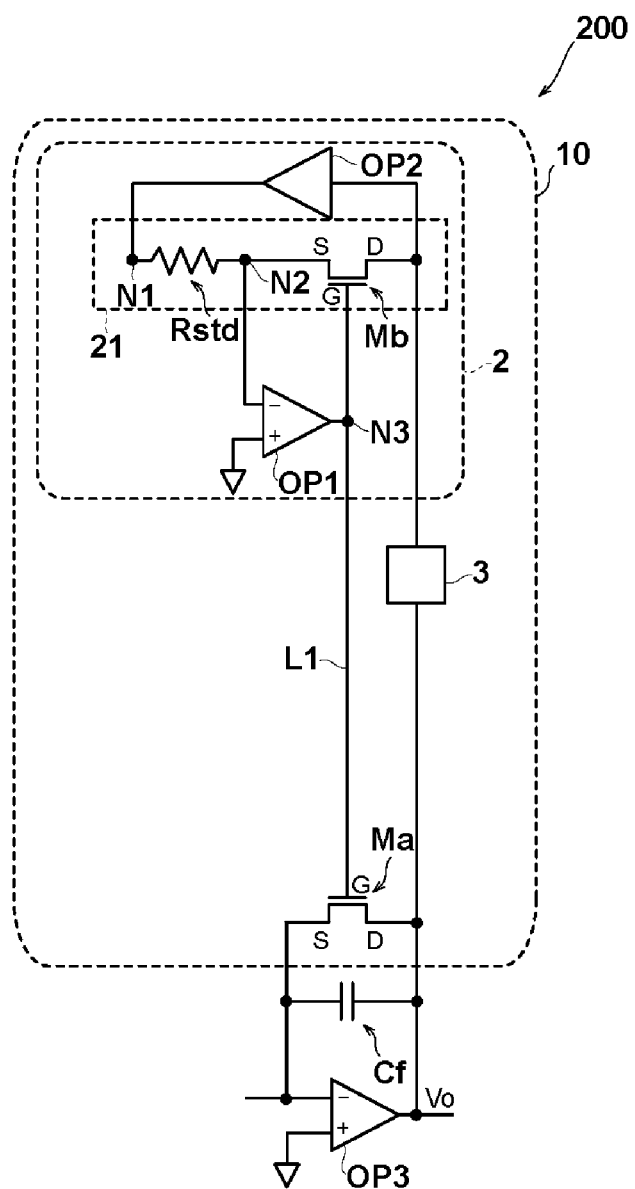
FIG. 4 is a circuit diagram illustrating a configuration of a charge amplifier to which the pseudo resistor circuit in the present embodiment is applied.

As illustrated in FIG. 3 and FIG. 4, a pseudo resistor circuit 10 in the present embodiment and a charge amplifier 200 using the pseudo resistor circuit 10 mainly differ from the pseudo resistor circuit 1 in the first embodiment and the charge amplifier 100 using the pseudo resistor circuit 1 in that an absolute value circuit 3 is added. The remaining configurations of the pseudo resistor circuit 10 and the charge amplifier 200 are the same as those of the pseudo resistor circuit 1 and the charge amplifier 100. Accordingly, the description of the present embodiment focuses on the above difference. The same reference numerals are used in the second embodiment to identify the same components in the first embodiments and a description of such components is simplified or omitted herein.

[Configuration and Operation of Pseudo Resistor Circuit]

The configuration and an operation of the pseudo resistor circuit 10 in the present embodiment will be described in detail with reference to FIG. 3.

As illustrated in FIG. 3, the pseudo resistor circuit 10 in the present embodiment further includes the absolute value circuit 3 provided between the drain terminal D of the first field effect transistor Ma and the drain terminal D of the second field effect transistor Mb in the pseudo resistor circuit 1 in the first embodiment.

The absolute value circuit 3 is provided in the pseudo resistor circuit 10 in the present embodiment in order to address the following phenomena.

In the pseudo resistor circuit 1 in the first embodiment, when the drain voltage Vo of the first field effect transistor Ma does not have a supposed positive value but has a negative value, the voltage at the node N2 has a negative value and the negative voltage is applied to the inverting input terminal (−) of the first operational amplifier OP1. Accordingly, the output voltage from the first operational amplifier OP1 is increased, the voltage at the node N3 is increased, and the gate voltage of the second field effect transistor Mb is increased to decrease the pseudo resistance value of the second field effect transistor Mb. As a result, the voltage at the node N2 is further decreased.

In addition, the feedback continuously caused by the first operational amplifier OP1 decreases the voltage at the node N2, which is a negative value. Accordingly, the output voltage from the first operational amplifier OP1 is increased, the voltage at the node N3 is further increased, and the gate voltage of the second field effect transistor Mb continues to be increased. As a result, positive feedback is caused to produce a phenomenon in which the pseudo resistance value of the second field effect transistor Mb continues to be decreased and is not stabilized.

Accordingly, in the pseudo resistor circuit 10 in the present embodiment, the provision of the absolute value circuit 3 causes the drain voltage Vo of the first field effect transistor Ma to be converted into a positive value even when the drain voltage Vo of the first field effect transistor Ma has a negative value. Accordingly, the voltage of the positive value is capable of being applied to the drain terminal D of the second field effect transistor Mb and the input-side terminal of the second operational amplifier OP2, as in the first embodiment.

As a result, also in the pseudo resistor circuit 10 in the present embodiment, the pseudo resistance value of the first field effect transistor Ma is stably kept at the constant value, as in the pseudo resistor circuit 1 in the first embodiment.

[Configuration and Operation of Charge Amplifier]

Next, the configuration and an operation of the charge amplifier 200 to which the pseudo resistor circuit 10 having the above configuration is applied will be described in detail with reference to FIG. 4.

As illustrated in FIG. 4, the charge amplifier 200 in the present embodiment includes the third operational amplifier OP3 and the capacitor Cf, as in the charge amplifier 100 in the first embodiment, in addition to the pseudo resistor circuit 10.

In the pseudo resistor circuit 10 in the present embodiment, since the drain voltage Vo of the first field effect transistor Ma is converted into a positive value even when the drain voltage Vo of the first field effect transistor Ma has a negative value because the absolute value circuit 3 is provided, the pseudo resistance value of the first field effect transistor Ma is stably kept at the constant value, as in the pseudo resistor circuit 1 in the first embodiment.

Accordingly, in the charge amplifier 200 in the present embodiment, the waveform distortion caused by the non-linearity of the pseudo resistance value is reduced in the output signal from the charge amplifier 200, which is output from the inverting input terminal (−) of the third operational amplifier OP3, as in the charge amplifier 100 in the first embodiment. In addition, since the first field effect transistor Ma has a relatively high pseudo resistance value, the detection signal in the low-frequency domain, which is output from the charge output sensor, is also reliably amplified by the third operational amplifier OP3 and is output from the charge amplifier 200, as in the charge amplifier 100 in the first embodiment.

Third Embodiment

Next, a pseudo resistor circuit in a third embodiment of the present invention and a charge amplifier using the pseudo resistor circuit will be described in detail with reference to FIG. 5 and FIG. 6.

Figure 5:
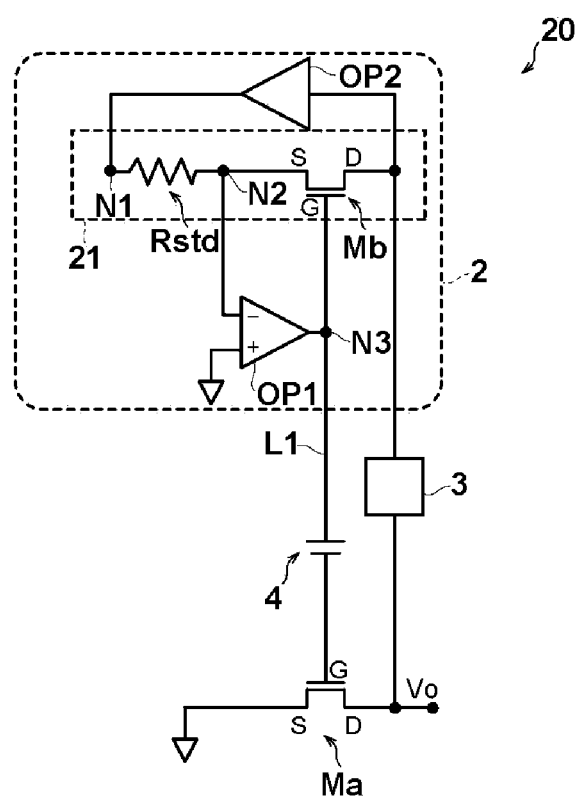
FIG. 5 is a circuit diagram illustrating a configuration of a pseudo resistor circuit in a third embodiment of the present invention.

FIG. 5 is a circuit diagram illustrating a configuration of the pseudo resistor circuit in the present embodiment. FIG. 6 is a circuit diagram illustrating a configuration of the charge amplifier to which the pseudo resistor circuit in the present embodiment is applied.

Figure 6:
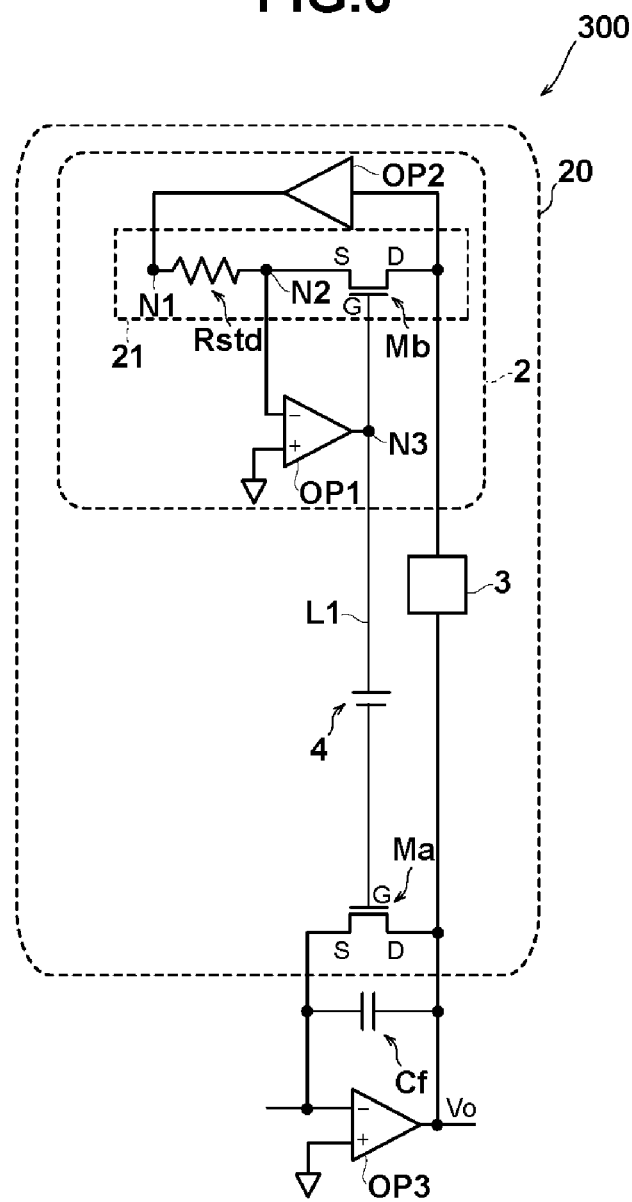
FIG. 6 is a circuit diagram illustrating a configuration of a charge amplifier to which the pseudo resistor circuit in the present embodiment is applied.

As illustrated in FIG. 5 and FIG. 6, a pseudo resistor circuit 20 in the present embodiment and a charge amplifier 300 using the pseudo resistor circuit 20 mainly differ from the pseudo resistor circuit 10 in the second embodiment and the charge amplifier 200 using the pseudo resistor circuit 10 in that a direct-current voltage source 4 is added. The remaining configurations of the pseudo resistor circuit 20 and the charge amplifier 300 are the same as those of the pseudo resistor circuit 10 and the charge amplifier 200. Accordingly, the description of the present embodiment focuses on the above difference. The same reference numerals are used in the third embodiment to identify the same components in the second embodiments and a description of such components is simplified or omitted herein.

[Configuration and Operation of Pseudo Resistor Circuit]

The configuration and an operation of the pseudo resistor circuit 20 in the present embodiment will be described in detail with reference to FIG. 5.

As illustrated in FIG. 5, the pseudo resistor circuit 20 in the present embodiment further includes the direct-current voltage source 4 of certain voltage, which is provided on the electrical wiring L1 that electrically connects the gate terminal G of the first field effect transistor Ma to the gate terminal G of the second field effect transistor Mb, in the pseudo resistor circuit 10 in the second embodiment.

Specifically, a negative terminal of the direct-current voltage source 4 is electrically connected to the gate terminal G of the first field effect transistor Ma and a positive terminal of the direct-current voltage source 4 is electrically connected to the gate terminal G of the second field effect transistor Mb.

In the pseudo resistor circuit 20 in the present embodiment, the provision of the direct-current voltage source 4 allows the gate voltage of the first field effect transistor Ma to be adjusted so as to be decreased using the voltage of the direct-current voltage source 4. The pseudo resistance value of the first field effect transistor Ma is capable of being adjusted to a higher value.

As a result, in the pseudo resistor circuit 20 in the present embodiment, the pseudo resistance value of the first field effect transistor Ma is stably kept at the constant value, as in the pseudo resistor circuit 10 in the second embodiment. In addition, the pseudo resistance value of the first field effect transistor Ma is capable of being adjusted to a higher value.

[Configuration and Operation of Charge Amplifier]

Next, the configuration and an operation of the charge amplifier 300 to which the pseudo resistor circuit 20 having the above configuration is applied will be described in detail with reference to FIG. 6.

As illustrated in FIG. 6, the charge amplifier 300 in the present embodiment includes the third operational amplifier OP3 and the capacitor Cf, as in the charge amplifier 200 in the second embodiment, in addition to the pseudo resistor circuit 20.

In the pseudo resistor circuit 20 in the present embodiment, since the drain voltage Vo of the first field effect transistor Ma is converted into a positive value even when the drain voltage Vo of the first field effect transistor Ma has a negative value, as in the pseudo resistor circuit 10 in the second embodiment, the waveform distortion caused by the non-linearity of the pseudo resistance value of the drain voltage Vo of the first field effect transistor Ma, that is, the output waveform output from the drain terminal D of the first field effect transistor Ma is reduced. In addition, the provision of the direct-current voltage source 4 allows the pseudo resistance value of the first field effect transistor Ma to be adjusted to a higher value.

Consequently, in the charge amplifier 300 in the present embodiment, the waveform distortion caused by the non-linearity of the pseudo resistance value is reduced in the output signal from the charge amplifier 300, which is output from the inverting input terminal (−) of the third operational amplifier OP3, as in the charge amplifier 200 in the second embodiment. In addition, the detection signal in the low-frequency domain, which is output from the charge output sensor, is also reliably amplified by the third operational amplifier OP3 and is output from the charge amplifier 300, compared with the charge amplifier 200 in the second embodiment.

In the direct-current voltage source 4 in the present embodiment, the positive terminal of the direct-current voltage source 4 may be electrically connected to the gate terminal G of the first field effect transistor Ma and the negative terminal of the direct-current voltage source 4 may be electrically connected to the gate terminal G of the second field effect transistor Mb to allow the pseudo resistance value of the first field effect transistor Ma to be adjusted to a lower value, if needed.

The direct-current voltage source 4 in the present embodiment may be applied to the pseudo resistor circuit 1 in the first embodiment and the charge amplifier 100 using the pseudo resistor circuit 1.

Fourth Embodiment

Next, a pseudo resistor circuit in a fourth embodiment of the present invention and a charge amplifier using the pseudo resistor circuit will be described in detail with reference to FIG. 7 and FIG. 8.

Figure 7:
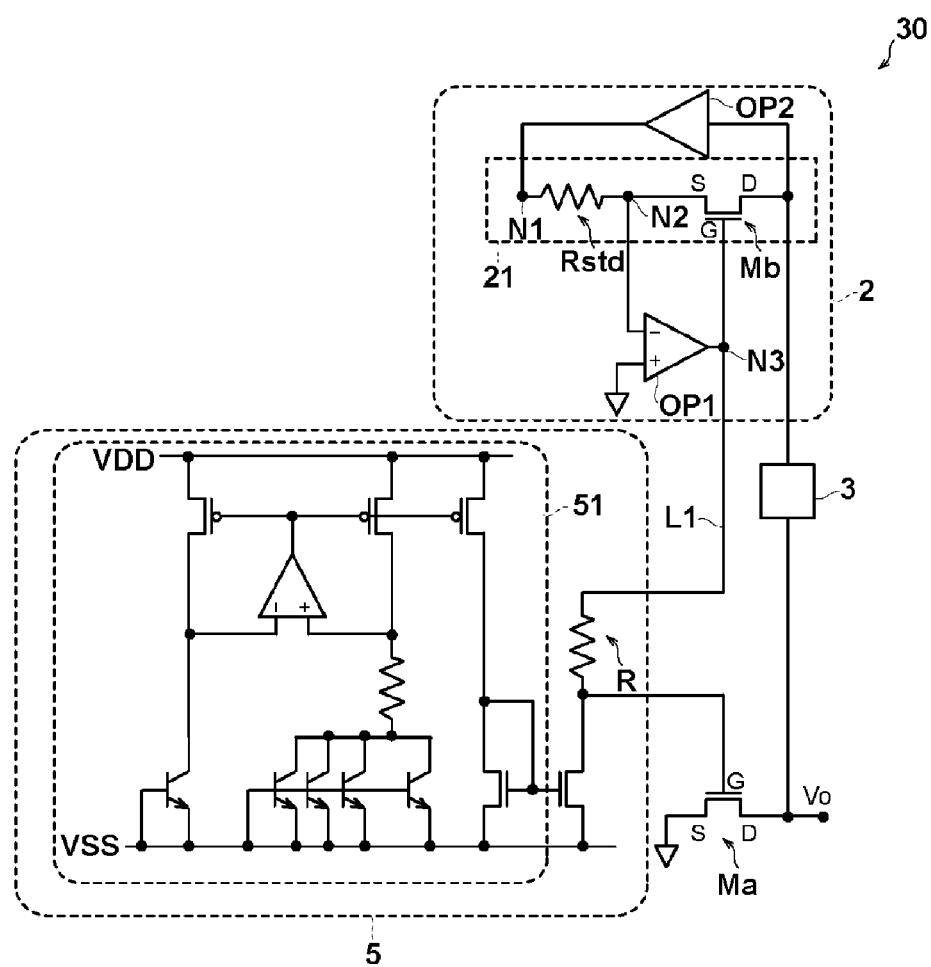
FIG. 7 is a circuit diagram illustrating a configuration of a pseudo resistor circuit in a fourth embodiment of the present invention.

FIG. 7 is a circuit diagram illustrating a configuration of the pseudo resistor circuit in the present embodiment. FIG. 8 is a circuit diagram illustrating a configuration of the charge amplifier to which the pseudo resistor circuit in the present embodiment is applied.

Figure 8:
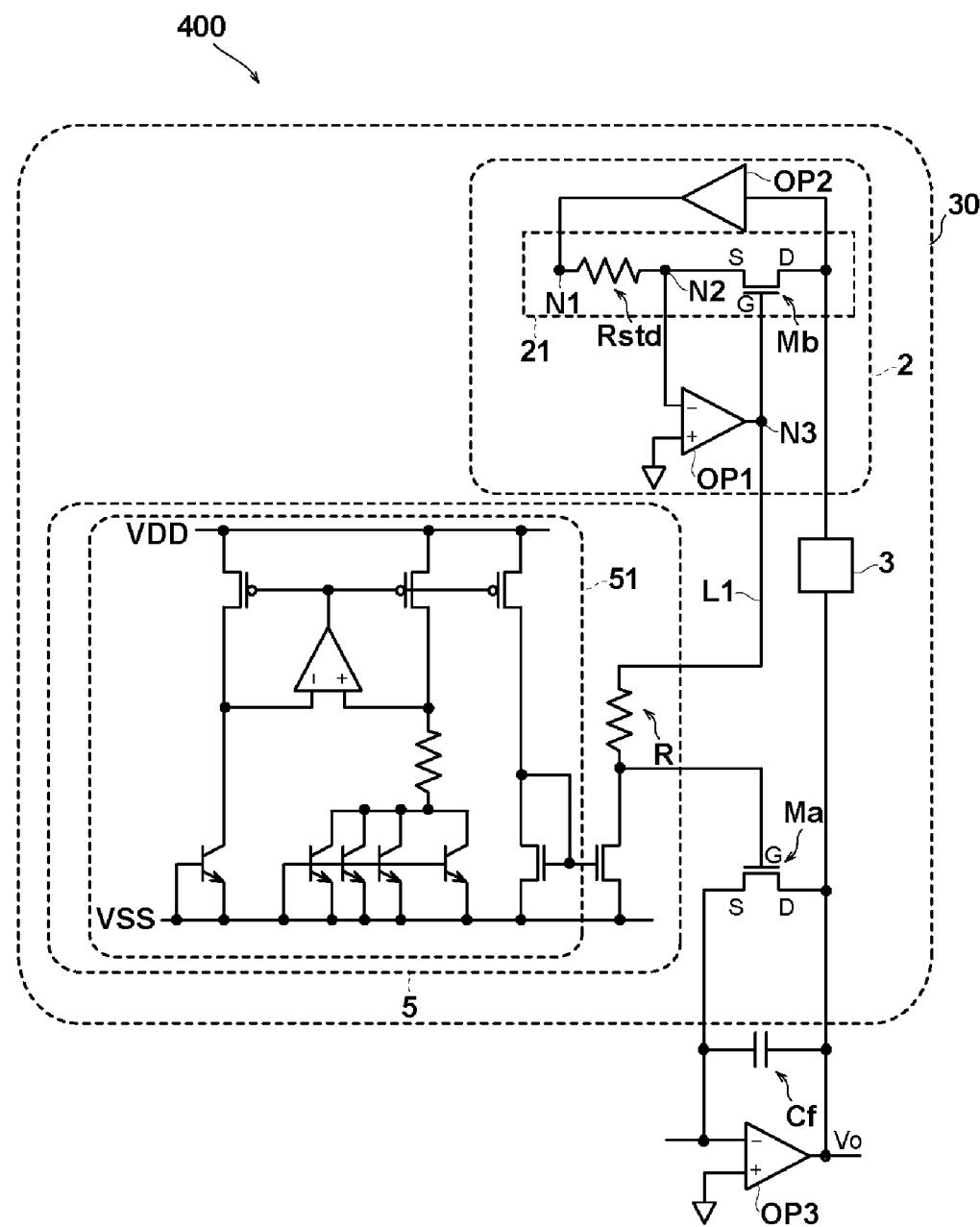
FIG. 8 is a circuit diagram illustrating a configuration of a charge amplifier to which the pseudo resistor circuit in the present embodiment is applied.

As illustrated in FIG. 7 and FIG. 8, a pseudo resistor circuit 30 in the present embodiment and a charge amplifier 400 using the pseudo resistor circuit 20 mainly differ from the pseudo resistor circuit 20 in the third embodiment and the absolute value circuit 300 using the pseudo resistor circuit 20 in that the direct-current voltage source 4 is replaced with a floating voltage source 5. The remaining configurations of the pseudo resistor circuit 30 and the charge amplifier 400 are the same as those of the pseudo resistor circuit 20 and the charge amplifier 300. Accordingly, the description of the present embodiment focuses on the above difference. The same reference numerals are used in the fourth embodiment to identify the same components in the third embodiments and a description of such components is simplified or omitted herein.

[Configuration and Operation of Pseudo Resistor Circuit]

The configuration and an operation of the pseudo resistor circuit 30 in the present embodiment will be described in detail with reference to FIG. 7.

As illustrated in FIG. 7, the pseudo resistor circuit 30 in the present embodiment includes the floating voltage source 5 including a proportional to absolute temperature (PTAT) current source 51 and a resistor R, instead of the direct-current voltage source 4, in the pseudo resistor circuit 20 in the third embodiment.

Specifically, an output terminal of the PTAT current source 51 is electrically connected to one terminal of the resistor R and the gate terminal G of the first field effect transistor Ma. The other terminal of the resistor R is electrically connected to the gate terminal G of the second field effect transistor Mb.

In the pseudo resistor circuit 30 in the present embodiment, the provision of the floating voltage source 5 allows the gate voltage of the first field effect transistor Ma to be adjusted using the output voltage proportional to the temperature of the floating voltage source 5. The pseudo resistance value of the first field effect transistor Ma is capable of being adjusted so as to offset the amount of variation caused by the variation in thermal voltage in the pseudo resistance value of the first field effect transistor Ma.

As a result, in the pseudo resistor circuit 30 in the present embodiment, the pseudo resistance value of the first field effect transistor Ma is capable of being adjusted to a higher value, etc., as in the pseudo resistor circuit 20 in the third embodiment. In addition, the provision of the floating voltage source 5 allows the pseudo resistance value of the first field effect transistor Ma to be adjusted so as to offset the amount of variation caused by the variation in thermal voltage in the pseudo resistance value of the first field effect transistor Ma to reduce the temperature dependence of the pseudo resistor circuit 30.

The internal circuit of the PTAT current source 51 illustrated in FIG. 7 is an example and the internal circuit of the PTAT current source is not limited to the one illustrated in FIG. 7. The PTAT current source 51 may adopt another well-known configuration.

[Configuration and Operation of Charge Amplifier]

Next, the configuration and an operation of the charge amplifier 400 to which the pseudo resistor circuit 30 having the above configuration is applied will be described in detail with reference to FIG. 8.

As illustrated in FIG. 8, the charge amplifier 400 in the present embodiment includes the third operational amplifier OP3 and the capacitor Cf, as in the charge amplifier 300 in the third embodiment, in addition to the pseudo resistor circuit 30.

In the pseudo resistor circuit 30 in the present embodiment, the pseudo resistance value of the first field effect transistor Ma is capable of being adjusted to a higher value, etc., as in the pseudo resistor circuit 20 in the third embodiment. In addition, the provision of the floating voltage source 5 allows the pseudo resistance value of the first field effect transistor Ma to be adjusted so as to offset the amount of variation caused by the variation in thermal voltage in the pseudo resistance value of the first field effect transistor Ma to reduce the temperature dependence of the pseudo resistor circuit 30.

Accordingly, in the charge amplifier 400 in the present embodiment, the output signal from the charge amplifier 400 is output from the inverting input terminal (−) of the third operational amplifier OP3 in a mode in which the detection signal in the lower-frequency domain, which is output from the charge output sensor, is reliably amplified by the third operational amplifier OP3 and the waveform distortion caused by the non-linearity of the pseudo resistance value is reduced, as in the charge amplifier 300 in the third embodiment. In addition, the temperature dependence of the charge amplifier 400 is reduced, compared with the charge amplifier 300 in the third embodiment.

The floating voltage source 5 in the present embodiment may be applied to the pseudo resistor circuit 1 in the first embodiment and the charge amplifier 100 using the pseudo resistor circuit 1.

Although the configurations including the absolute value circuit 3 are described above in the second to fourth embodiments, the absolute value circuit 3 may be replaced with a floating voltage source. A fifth embodiment and the subsequent embodiments each having a configuration in which the absolute value circuit 3 is replaced with the floating voltage source will be described in detail with appropriate reference to the drawings.

Fifth Embodiment

First, a pseudo resistor circuit in the fifth embodiment of the present invention and a charge amplifier using the pseudo resistor circuit will be described in detail with reference to FIG. 9 and FIG. 10.

Figure 9:
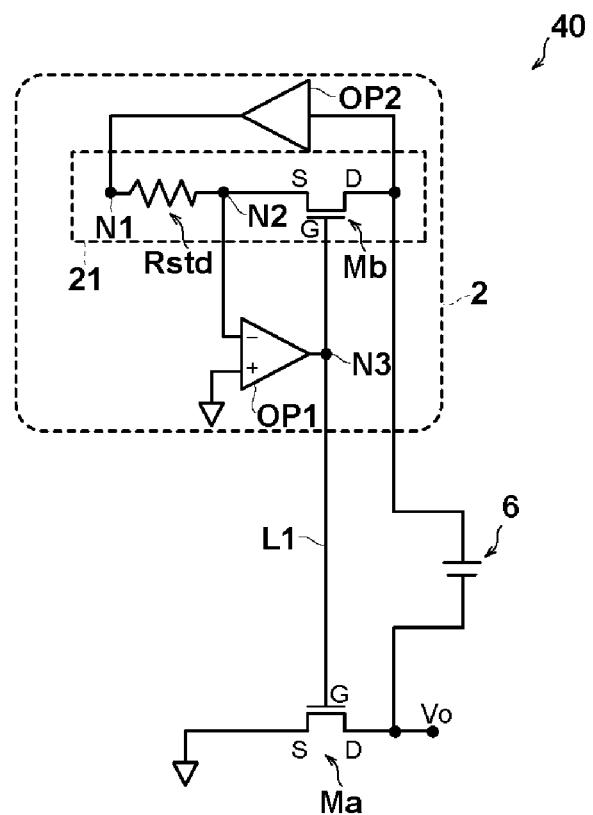
FIG. 9 is a circuit diagram illustrating a configuration of a pseudo resistor circuit in a fifth embodiment of the present invention.

FIG. 9 is a circuit diagram illustrating a configuration of the pseudo resistor circuit in the present embodiment. FIG. 10 is a circuit diagram illustrating a configuration of the charge amplifier to which the pseudo resistor circuit in the present embodiment is applied.

Figure 10:
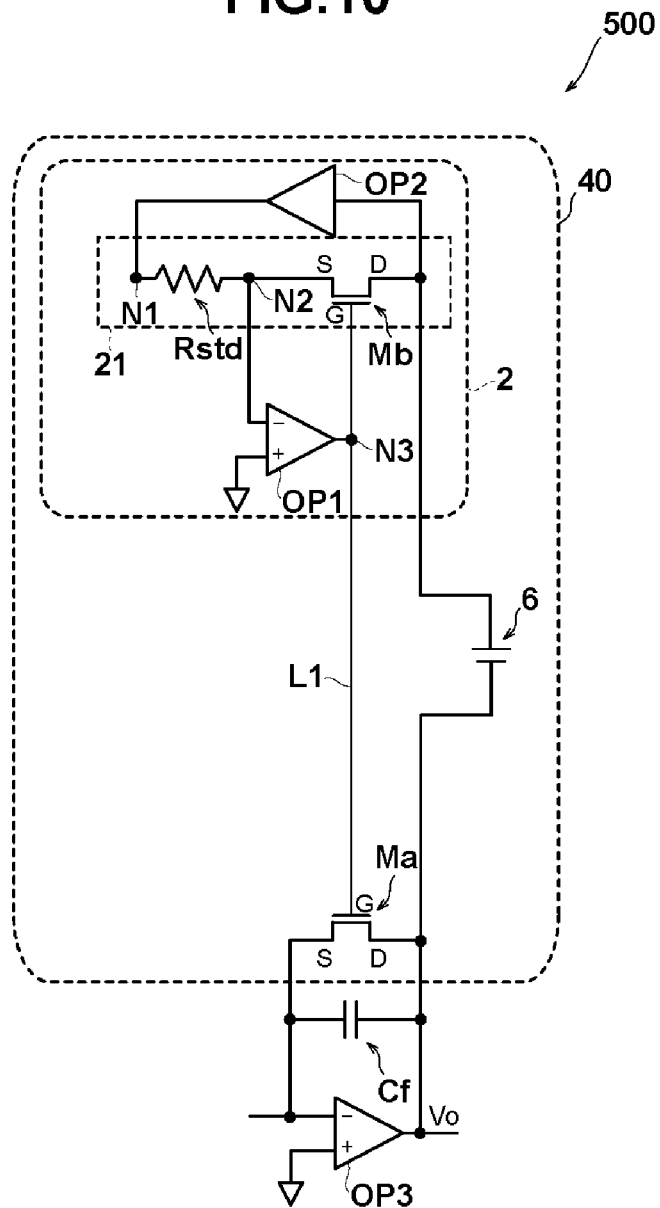
FIG. 10 is a circuit diagram illustrating a configuration of a charge amplifier to which the pseudo resistor circuit in the present embodiment is applied.

As illustrated in FIG. 9 and FIG. 10, a pseudo resistor circuit 40 in the present embodiment and a charge amplifier 500 using the pseudo resistor circuit 40 mainly differ from the pseudo resistor circuit 10 in the second embodiment and the charge amplifier 200 using the pseudo resistor circuit 10 in that the absolute value circuit 3 is replaced with a floating voltage source 6. The remaining configurations of the pseudo resistor circuit 40 and the charge amplifier 500 are the same as those of the pseudo resistor circuit 10 and the charge amplifier 200. Accordingly, the description of the present embodiment focuses on the above difference. The same reference numerals are used in the fifth embodiment to identify the same components in the second embodiment and a description of such components is simplified or omitted herein.

[Configuration and Operation of Pseudo Resistor Circuit]

The configuration and an operation of the pseudo resistor circuit 40 in the present embodiment will be described in detail with reference to FIG. 9.

As illustrated in FIG. 9, the pseudo resistor circuit 40 in the present embodiment includes the floating voltage source 6, instead of the absolute value circuit 3 provided between the drain terminal D of the first field effect transistor Ma and the drain terminal D of the second field effect transistor Mb, in the pseudo resistor circuit 10 in the second embodiment. The configuration of the floating voltage source (drain-side floating voltage source) 6 is the same as that of the floating voltage source (gate-side floating voltage source) 5 described above in the fourth embodiment.

The floating voltage source 6 is provided in the pseudo resistor circuit 40 in the present embodiment in the above manner in order to, as in the provision of the absolute value circuit 3 in the pseudo resistor circuit 10 in the second embodiment, convert the drain voltage Vo of the first field effect transistor Ma into a positive value even when the drain voltage Vo of the first field effect transistor Ma has a negative value to apply the voltage of the positive value to the drain terminal D of the second field effect transistor Mb and the input-side terminal of the second operational amplifier OP2, as in the second embodiment.

Specifically, the negative terminal of the floating voltage source 6 is electrically connected to the drain terminal D of the first field effect transistor Ma and the positive terminal of the floating voltage source 6 is electrically connected to the drain terminal D of the second field effect transistor Mb. The specific configuration of the floating voltage source 6 is the same as that of the floating voltage source 5 described above in the fourth embodiment and the configuration of the floating voltage source 6 is not illustrated in detail herein. As described above as an example in the fourth embodiment, the floating voltage source 6 includes the PTAT current source and the resistor. Specifically, the output terminal of the PTAT current source is electrically connected to one terminal of the resistor R and the drain terminal D of the first field effect transistor Ma and the other terminal of the resistor is electrically connected to the drain terminal D of the second field effect transistor Mb.

A voltage value Voff of the floating voltage source 6 is required to be set to a positive value higher than an amplitude maximum value Vmax of the drain voltage Vo of the first field effect transistor Ma (Voff>Vmax).

The provision of the floating voltage source 6 allows the drain voltage Vo of the first field effect transistor Ma to be converted into a positive value even when the drain voltage Vo of the first field effect transistor Ma does not have a supposed positive value but has a negative value. The voltage of the positive value is capable of being applied to the drain terminal D of the second field effect transistor Mb and the input-side terminal of the second operational amplifier OP2, as in the second embodiment.

In addition, the pseudo resistance value of the first field effect transistor Ma is exponentially varied not only with a value resulting from standardization of the gate voltage of the first field effect transistor Ma with the thermal voltage but also with a value resulting from standardization of the drain voltage of the first field effect transistor Ma with the thermal voltage. Accordingly, the provision of the floating voltage source 6, which outputs the voltage value proportional to the thermal voltage, allows the drain voltage of the first field effect transistor Ma to be adjusted. The pseudo resistance value of the first field effect transistor Ma is capable of being adjusted so as to offset the amount of variation caused by the variation in thermal voltage in the pseudo resistance value of the first field effect transistor Ma.

Accordingly, the provision of the floating voltage source 6 allows the voltage of the positive value to be applied to the drain terminal D of the second field effect transistor Mb and the input-side terminal of the second operational amplifier OP2, as in the second embodiment. In addition, the amount of variation caused by the variation in thermal voltage concerning the drain voltage in the pseudo resistance value of the first field effect transistor Ma is capable of being offset.

As a result, also in the pseudo resistor circuit 40 in the present embodiment, the pseudo resistance value of the first field effect transistor Ma is stably kept at the constant value, as in the pseudo resistor circuit 10 in the second embodiment. In addition, the provision of the floating voltage source 6 allows the pseudo resistance value of the first field effect transistor Ma to be adjusted so as to offset the amount of variation caused by the variation in thermal voltage concerning the drain voltage in the pseudo resistance value of the first field effect transistor Ma to reduce the temperature dependence of the pseudo resistor circuit 40.

[Configuration and Operation of Charge Amplifier]

Next, the configuration and an operation of the charge amplifier 500 to which the pseudo resistor circuit 40 having the above configuration is applied will be described in detail with reference to FIG. 10.

As illustrated in FIG. 10, the charge amplifier 500 in the present embodiment includes the third operational amplifier OP3 and the capacitor Cf, as in the charge amplifier 200 in the second embodiment, in addition to the pseudo resistor circuit 40.

In the pseudo resistor circuit 40 in the present embodiment, since the provision of the floating voltage source 6 allows the drain voltage Vo of the first field effect transistor Ma to be converted into a positive value even when the drain voltage Vo of the first field effect transistor Ma has a negative value, the pseudo resistance value of the first field effect transistor Ma is stably kept at the constant value, as in the pseudo resistor circuit 1 in the first embodiment. In addition, the provision of the floating voltage source 6 allows the pseudo resistance value of the first field effect transistor Ma to be adjusted so as to offset the amount of variation caused by the variation in thermal voltage concerning the drain voltage in the pseudo resistance value of the first field effect transistor Ma to reduce the temperature dependence of the pseudo resistor circuit 40.

Accordingly, in the charge amplifier 500 in the present embodiment, the output signal from the charge amplifier 500, which is output from the inverting input terminal (−) of the third operational amplifier OP3, is reliably amplified by the third operational amplifier OP3 and is output from the charge amplifier 500 in a mode in which the waveform distortion caused by the non-linearity of the pseudo resistance value is reduced in the detection signal in the lower-frequency domain, which is output from the charge output sensor, as in the charge amplifier 200 in the second embodiment.

Instead of the floating voltage source 6 in the present embodiment, a direct-current voltage source the voltage of which meets Voff>Vmax may be provided. In such a case, although the amount of variation caused by the variation in thermal voltage concerning the drain voltage in the pseudo resistance value of the first field effect transistor Ma is not offset, the drain voltage Vo of the first field effect transistor Ma is capable of being converted into a positive value even when the drain voltage Vo of the first field effect transistor Ma has a negative value. Accordingly, the voltage of the positive value is capable of being applied to the drain terminal D of the second field effect transistor Mb and the input-side terminal of the second operational amplifier OP2, as in the second embodiment.

Sixth Embodiment

Next, a pseudo resistor circuit in a sixth embodiment of the present invention and a charge amplifier using the pseudo resistor circuit will be described in detail with reference to FIG. 11 and FIG. 12.

Figure 11:
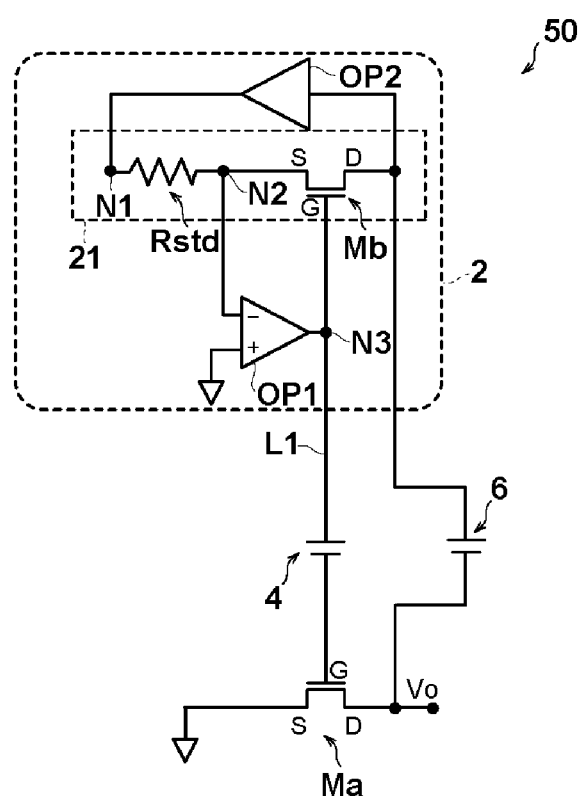
FIG. 11 is a circuit diagram illustrating a configuration of a pseudo resistor circuit in a sixth embodiment of the present invention.

FIG. 11 is a circuit diagram illustrating a configuration of the pseudo resistor circuit in the present embodiment. FIG. 12 is a circuit diagram illustrating a configuration of the charge amplifier to which the pseudo resistor circuit in the present embodiment is applied.

Figure 12:
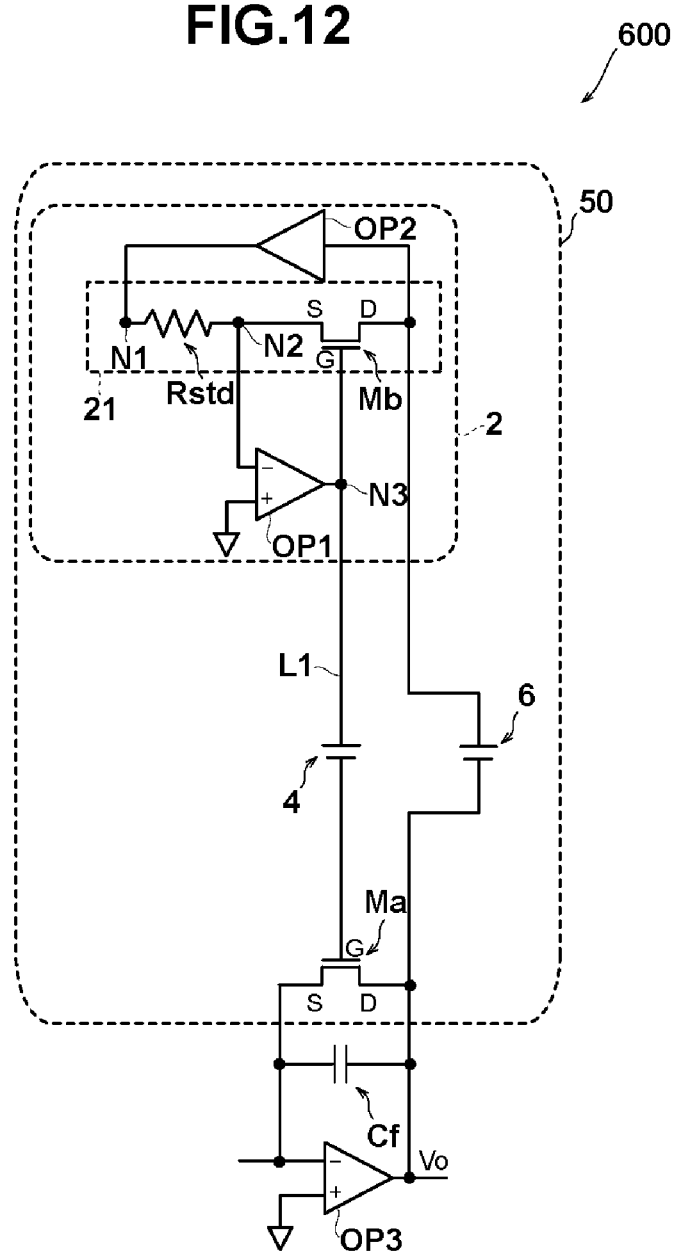
FIG. 12 is a circuit diagram illustrating a configuration of a charge amplifier to which the pseudo resistor circuit in the present embodiment is applied.

As illustrated in FIG. 11 and FIG. 12, a pseudo resistor circuit 50 in the present embodiment and a charge amplifier 600 using the pseudo resistor circuit 50 mainly differ from the pseudo resistor circuit 40 in the fifth embodiment and the charge amplifier 500 using the pseudo resistor circuit 40 in that the direct-current voltage source 4 is added. The remaining configurations of the pseudo resistor circuit 50 and the charge amplifier 600 are the same as those of the pseudo resistor circuit 40 and the charge amplifier 500. Accordingly, the description of the present embodiment focuses on the above difference. The same reference numerals are used in the sixth embodiment to identify the same components in the fifth embodiment and a description of such components is simplified or omitted herein.

[Configuration and Operation of Pseudo Resistor Circuit]

The configuration and an operation of the pseudo resistor circuit 50 in the present embodiment will be described in detail with reference to FIG. 11.

As illustrated in FIG. 11, the pseudo resistor circuit 50 in the present embodiment further includes the direct-current voltage source 4 on the electrical wiring L1 that electrically connects the gate terminal G of the first field effect transistor Ma to the gate terminal G of the second field effect transistor Mb in the pseudo resistor circuit 40 in the fifth embodiment. The configuration of the direct-current voltage source 4 is the same as that in the third embodiment.

Specifically, in the pseudo resistor circuit 50 in the present embodiment, the provision of the direct-current voltage source 4 allows the gate voltage of the first field effect transistor Ma to be adjusted so as to be decreased using the voltage of the direct-current voltage source 4. The pseudo resistance value of the first field effect transistor Ma is capable of being adjusted to a higher value.

As a result, in the pseudo resistor circuit 50 in the present embodiment, the pseudo resistance value of the first field effect transistor Ma is capable of being adjusted so as to offset the amount of variation caused by the variation in thermal voltage concerning the drain voltage in the pseudo resistance value of the first field effect transistor Ma and is stably kept at the constant value in which the temperature dependence is reduced, as in the pseudo resistor circuit 40 in the fifth embodiment. In addition, the pseudo resistance value of the first field effect transistor Ma is capable of being adjusted to a higher value.

[Configuration and Operation of Charge Amplifier]

Next, the configuration and an operation of the charge amplifier 600 to which the pseudo resistor circuit 50 having the above configuration is applied will be described in detail with reference to FIG. 12.

As illustrated in FIG. 12, the charge amplifier 600 in the present embodiment includes the third operational amplifier OP3 and the capacitor Cf, as in the charge amplifier 500 in the fifth embodiment, in addition to the pseudo resistor circuit 50.

In the pseudo resistor circuit 50 in the present embodiment, the drain voltage Vo of the first field effect transistor Ma is converted into a positive value even when the drain voltage Vo of the first field effect transistor Ma has a negative value and the pseudo resistance value of the first field effect transistor Ma is capable of being adjusted so as to offset the amount of variation caused by the variation in thermal voltage concerning the drain voltage in the pseudo resistance value of the first field effect transistor Ma to reduce the temperature dependence of the pseudo resistor circuit 50, as in the pseudo resistor circuit 40 in the fifth embodiment. Accordingly, the waveform distortion caused by the non-linearity and the temperature dependence of the pseudo resistance value of the drain voltage Vo of the first field effect transistor Ma, that is, the output waveform output from the drain terminal D of the first field effect transistor Ma is reduced. In addition, the provision of the direct-current voltage source 4 allows the pseudo resistance value of the first field effect transistor Ma to be adjusted to a higher value.

Consequently, in the charge amplifier 600 in the present embodiment, the waveform distortion caused by the non-linearity and the temperature dependence of the pseudo resistance value is reduced in the output signal from the charge amplifier 600, which is output from the inverting input terminal (−) of the third operational amplifier OP3, as in the charge amplifier 500 in the fifth embodiment. In addition, the detection signal in the low-frequency domain, which is output from the charge output sensor, is also reliably amplified by the third operational amplifier OP3 and is output from the charge amplifier 600, compared with the charge amplifier 500 in the fifth embodiment.

Seventh Embodiment

Next, a pseudo resistor circuit in a seventh embodiment of the present invention and a charge amplifier using the pseudo resistor circuit will be described in detail with reference to FIG. 13 and FIG. 14.

Figure 13:
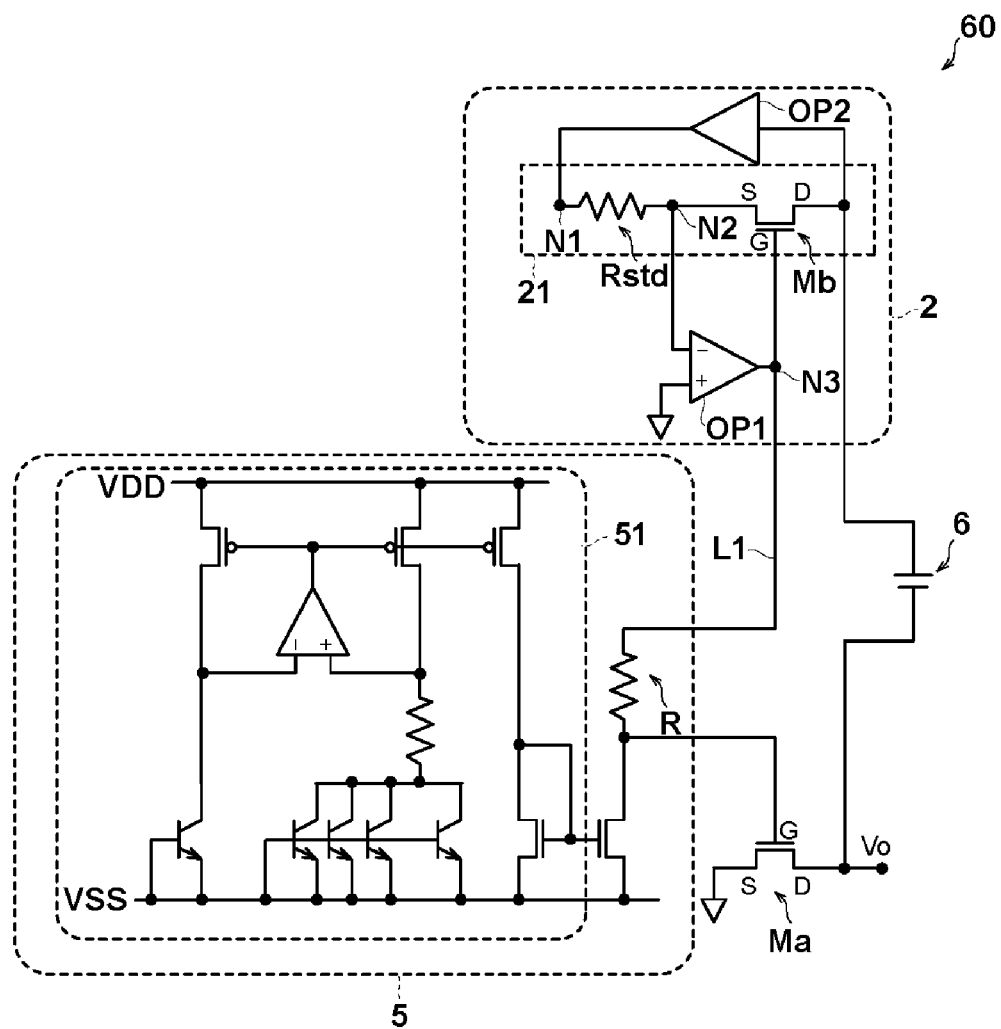
FIG. 13 is a circuit diagram illustrating a configuration of a pseudo resistor circuit in a seventh embodiment of the present invention.

FIG. 13 is a circuit diagram illustrating a configuration of the pseudo resistor circuit in the present embodiment. FIG. 14 is a circuit diagram illustrating a configuration of the charge amplifier to which the pseudo resistor circuit in the present embodiment is applied.

Figure 14:
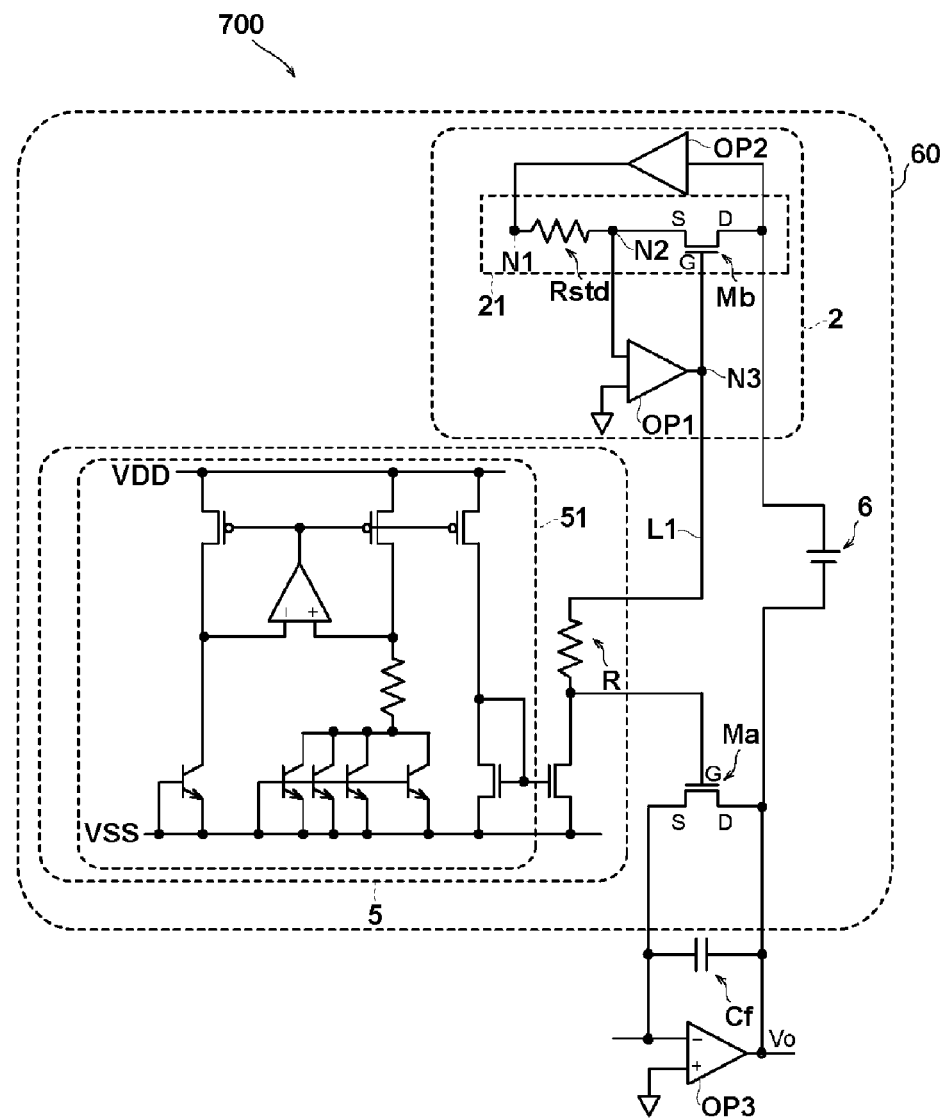
FIG. 14 is a circuit diagram illustrating a configuration of a charge amplifier to which the pseudo resistor circuit in the present embodiment is applied.

As illustrated in FIG. 13 and FIG. 14, a pseudo resistor circuit 60 in the present embodiment and a charge amplifier 700 using the pseudo resistor circuit 60 mainly differ from the pseudo resistor circuit 50 in the sixth embodiment and the charge amplifier 600 using the pseudo resistor circuit 50 in that the direct-current voltage source 4 is replaced with the floating voltage source 5. The remaining configurations of the pseudo resistor circuit 60 and the charge amplifier 700 are the same as those of the pseudo resistor circuit 50 and the charge amplifier 600. Accordingly, the description of the present embodiment focuses on the above difference. The same reference numerals are used in the seventh embodiment to identify the same components in the sixth embodiment and a description of such components is simplified or omitted herein.

[Configuration and Operation of Pseudo Resistor Circuit]

The configuration and an operation of the pseudo resistor circuit 60 in the present embodiment will be described in detail with reference to FIG. 13.

As illustrated in FIG. 13, the pseudo resistor circuit 60 in the present embodiment includes the floating voltage source 5 including the PTAT current source 51 and the resistor R, instead of the direct-current voltage source 4, in the pseudo resistor circuit 50 in the sixth embodiment. The configuration of the floating voltage source (the gate-side floating voltage source) 5 is the same as that in the fourth embodiment.

Specifically, in the pseudo resistor circuit 60 in the present embodiment, the provision of the floating voltage source 5 allows the gate voltage of the first field effect transistor Ma to be adjusted using the output voltage proportional to the temperature of the floating voltage source 5. The pseudo resistance value of the first field effect transistor Ma is capable of being adjusted so as to offset the amount of variation caused by the variation in thermal voltage in the pseudo resistance value of the first field effect transistor Ma.

As a result, in the pseudo resistor circuit 60 in the present embodiment, the pseudo resistance value of the first field effect transistor Ma is capable of being adjusted so as to offset the amount of variation caused by the variation in thermal voltage concerning the drain voltage in the pseudo resistance value of the first field effect transistor Ma, is stably kept at the constant value in which the temperature dependence is reduced, and is capable of being adjusted to a higher value, as in the pseudo resistor circuit 50 in the sixth embodiment. In addition, the provision of the floating voltage source 5 allows the pseudo resistance value of the first field effect transistor Ma to be adjusted so as to offset the amount of variation caused by the variation in thermal voltage concerning the gate voltage in the pseudo resistance value of the first field effect transistor Ma to reduce the temperature dependence of the pseudo resistor circuit 60.

[Configuration and Operation of Charge Amplifier]

Next, the configuration and an operation of the charge amplifier 700 to which the pseudo resistor circuit 60 having the above configuration is applied will be described in detail with reference to FIG. 14.

As illustrated in FIG. 14, the charge amplifier 700 in the present embodiment includes the third operational amplifier OP3 and the capacitor Cf, as in the charge amplifier 600 in the sixth embodiment, in addition to the pseudo resistor circuit 60.

In the pseudo resistor circuit 60 in the present embodiment, the pseudo resistance value of the first field effect transistor Ma is capable of being adjusted to a higher value, etc., as in the pseudo resistor circuit 50 in the sixth embodiment. In addition, the provision of the floating voltage source 5 allows the pseudo resistance value of the first field effect transistor Ma to be adjusted so as to offset the amount of variation caused by the variation in thermal voltage concerning the gate voltage in the pseudo resistance value of the first field effect transistor Ma to reduce the temperature dependence of the pseudo resistor circuit 60.

Accordingly, in the charge amplifier 700 in the present embodiment, the output signal from the charge amplifier 700 is output from the inverting input terminal (−) of the third operational amplifier OP3 in a mode in which the detection signal in the lower-frequency domain, which is output from the charge output sensor, is reliably amplified by the third operational amplifier OP3 and the waveform distortion caused by the non-linearity and the temperature dependence of the pseudo resistance value is reduced, as in the charge amplifier 600 in the sixth embodiment. In addition, the temperature dependence of the charge amplifier 700 is further reduced, compared with the charge amplifier 600 in the sixth embodiment.

Although the cases in which the drain voltage Vo of the first field effect transistor Ma has a positive value are described in the above embodiments, the drain voltage Vo of the first field effect transistor Ma may have a negative value. Accordingly, pseudo resistor circuits in embodiments of the present invention and charge amplifiers using the pseudo resistor circuits will be described in detail below with appropriate reference to the drawings in the cases in which the drain voltage Vo of the first field effect transistor Ma has a negative value.

Eighth Embodiment

First, a pseudo resistor circuit in an eighth embodiment of the present invention and a charge amplifier using the pseudo resistor circuit will be described in detail with reference to FIG. 15 and FIG. 16.

Figure 15:
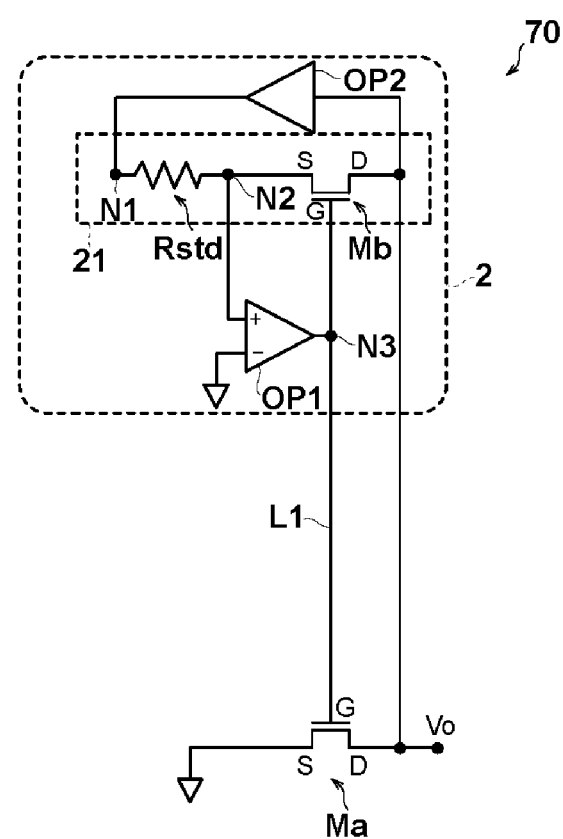
FIG. 15 is a circuit diagram illustrating a configuration of a pseudo resistor circuit in an eighth embodiment of the present invention.

FIG. 15 is a circuit diagram illustrating a configuration of the pseudo resistor circuit in the present embodiment. FIG. 16 is a circuit diagram illustrating a configuration of the charge amplifier to which the pseudo resistor circuit in the present embodiment is applied.

Figure 16:
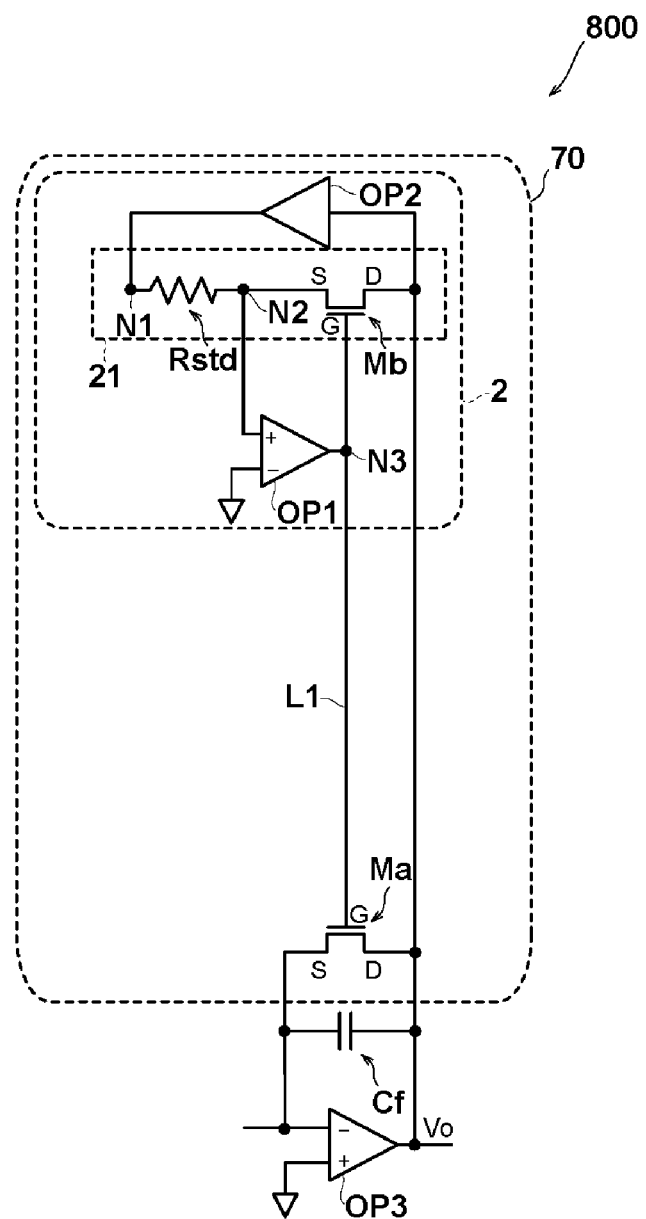
FIG. 16 is a circuit diagram illustrating a configuration of a charge amplifier to which the pseudo resistor circuit in the present embodiment is applied.

As illustrated in FIG. 15 and FIG. 16, a pseudo resistor circuit 70 in the present embodiment and a charge amplifier 800 using the pseudo resistor circuit 70 mainly differ from the pseudo resistor circuit 1 in the first embodiment and the charge amplifier 100 using the pseudo resistor circuit 1 in that the drain voltage Vo of the first field effect transistor Ma has a negative value. The remaining configurations of the pseudo resistor circuit 70 and the charge amplifier 800 are the same as those of the pseudo resistor circuit 1 and the charge amplifier 100. Accordingly, the description of the present embodiment focuses on the above difference. The same reference numerals are used in the eighth embodiment to identify the same components in the first embodiment and a description of such components is simplified or omitted herein.

[Configuration and Operation of Pseudo Resistor Circuit]

The configuration and an operation of the pseudo resistor circuit 70 in the present embodiment will be described in detail with reference to FIG. 15.

As illustrated in FIG. 15, in the pseudo resistor circuit 70 in the present embodiment, the electrical connection relationship between the inverting input terminal (−) and the non-inverting input terminal (+) of the first operational amplifier OP1 differs from that in the pseudo resistor circuit 1 in the first embodiment in association with the drain voltage Vo of the first field effect transistor Ma, which has a negative value. Specifically, the inverting input terminal (−) of the first operational amplifier OP1 is electrically connected to the reference voltage terminal, such as the ground terminal, which supplies certain reference voltage, and the non-inverting input terminal (+) of the first operational amplifier OP1 is electrically connected between one terminal of the reference resistor Rstd and the source terminal S of the second field effect transistor Mb, that is, to the midpoint voltage of the voltage dividing circuit 21 via the node N2. However, the output terminal of the first operational amplifier OP1 is electrically connected to the gate terminal G of the first field effect transistor Ma and the gate terminal G of the second field effect transistor Mb via the node N3, as in the pseudo resistor circuit 1 in the first embodiment.

The operation of the pseudo resistor circuit 70 having the above configuration will now be considered in the case in which the voltage at the gate terminal G of the first field effect transistor Ma and the voltage at the gate terminal G of the second field effect transistor Mb are higher than a certain value, that is, the pseudo resistance values of the first field effect transistor Ma and the second field effect transistor Mb are lower than the certain value, as in the pseudo resistor circuit 1 in the first embodiment.

Under the above conditions, negative voltage is input into the non-inverting input terminal (+) of the first operational amplifier OP1 in association with the voltage at the node N2, which has a value between the reference voltage and the drain voltage Vo, that is, a negative value. Accordingly, the voltage at the node N3 is decreased in response to the decrease in the output voltage from the first operational amplifier OP1, the gate voltage of the second field effect transistor Mb is decreased, and the pseudo resistance value of the second field effect transistor Mb is increased. As a result, the voltage at the node N2 is decreased.

In addition, negative feedback is continuously caused by the first operational amplifier OP1 to stabilize the voltage at the node N2 to the reference voltage. As a result, the stabilization of the output voltage from the first operational amplifier OP1 stabilizes the voltage at the node N3 and the gate voltage of the first field effect transistor Ma is stabilized to a constant value.

In other words, the negative feedback operation of the first operational amplifier OP1 causes the pseudo resistance value of the first field effect transistor Ma to be gradually increased and be finally stabilized to the constant value, as in the pseudo resistor circuit 1 in the first embodiment. Also when the voltage at the gate terminal G of the first field effect transistor Ma and the voltage at the gate terminal G of the second field effect transistor Mb are lower than the certain value, that is, the pseudo resistance values of the first field effect transistor Ma and the second field effect transistor Mb are higher than the certain value, the pseudo resistance value of the first field effect transistor Ma is finally stabilized to the constant value.

Accordingly, in the pseudo resistor circuit 70 having the above configuration, the pseudo resistance value of the first field effect transistor Ma is stably kept at the constant value.

[Configuration and Operation of Charge Amplifier]

Next, the configuration and an operation of the charge amplifier 800 to which the pseudo resistor circuit 70 having the above configuration is applied will be described in detail with reference to FIG. 16.

As illustrated in FIG. 16, the charge amplifier 800 includes the third operational amplifier OP3 and the capacitor Cf, as in the charge amplifier 100 in the first embodiment, in addition to the pseudo resistor circuit 70.

In the charge amplifier 800 having the above configuration, the detection signal from the charge output sensor (not illustrated) is input into the inverting input terminal (−) of the third operational amplifier OP3 and is output as an amplified signal, as in the charge amplifier 100 in the first embodiment.

At this time, since the pseudo resistance value of the first field effect transistor Ma is stabilized to the constant value in the pseudo resistor circuit 70, the waveform distortion caused by the non-linearity of the pseudo resistance value is reduced in the output signal from the charge amplifier 800, which is output from the inverting input terminal (−) of the third operational amplifier OP3. In addition, since the first field effect transistor Ma has a relatively high pseudo resistance value, the detection signal in the low-frequency domain, which is output from the charge output sensor, is also reliably amplified by the third operational amplifier OP3 and is output from the charge amplifier 800. Furthermore, the integration is easily achieved in the charge amplifier 800 including the pseudo resistor circuit 70.

Ninth Embodiment

Next, a pseudo resistor circuit in a ninth embodiment of the present invention and a charge amplifier using the pseudo resistor circuit will be described in detail with reference to FIG. 17 and FIG. 18.

Figure 17:
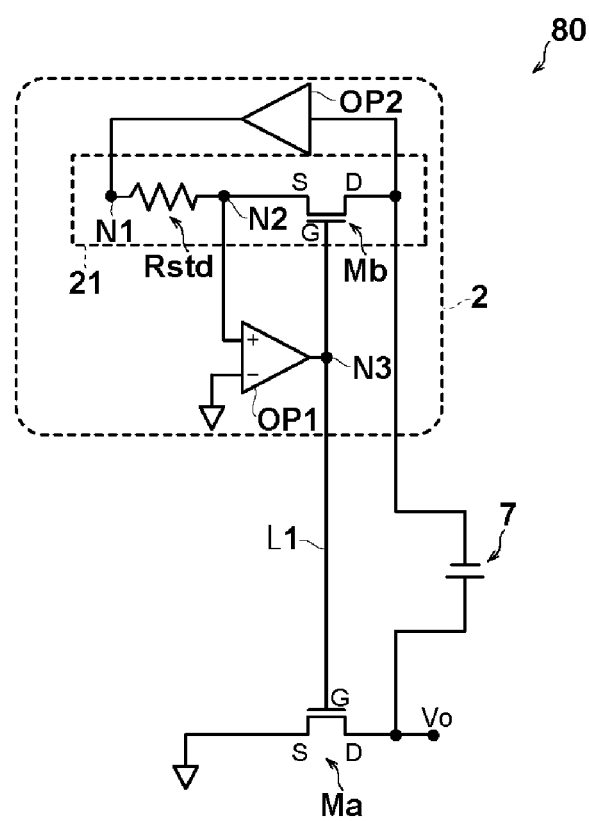
FIG. 17 is a circuit diagram illustrating a configuration of a pseudo resistor circuit in a ninth embodiment of the present invention.

FIG. 17 is a circuit diagram illustrating a configuration of the pseudo resistor circuit in the present embodiment. FIG. 18 is a circuit diagram illustrating a configuration of the charge amplifier to which the pseudo resistor circuit in the present embodiment is applied.

Figure 18:
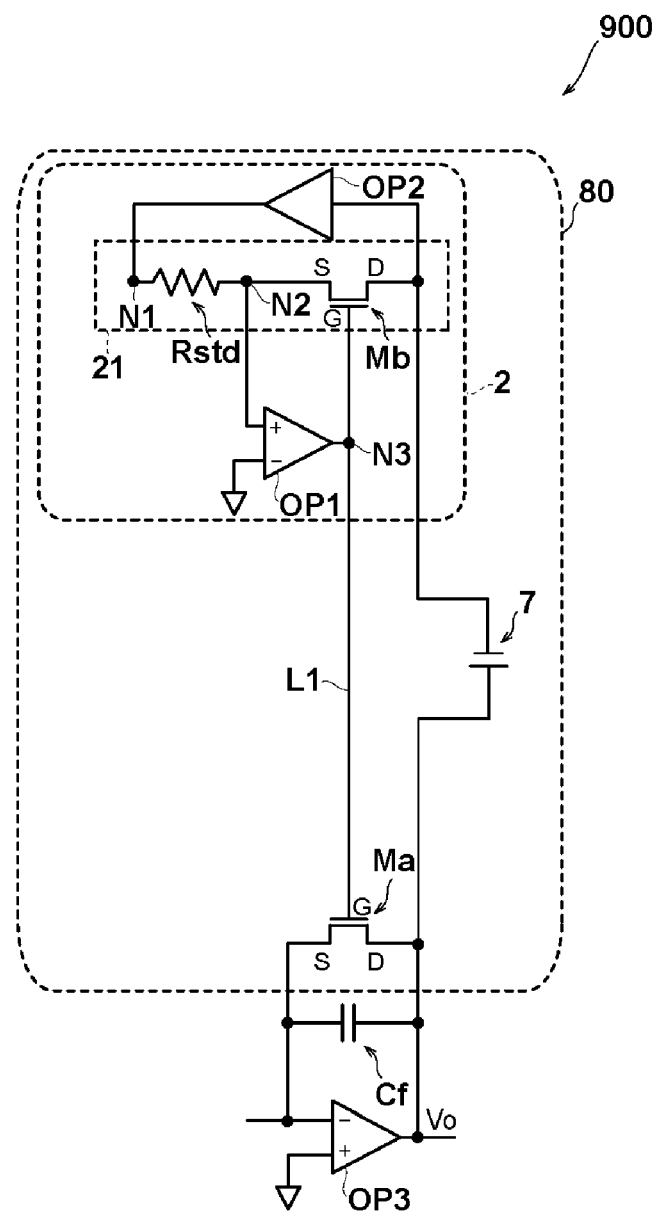
FIG. 18 is a circuit diagram illustrating a configuration of a charge amplifier to which the pseudo resistor circuit in the present embodiment is applied.

As illustrated in FIG. 17 and FIG. 18, a pseudo resistor circuit 80 in the present embodiment and a charge amplifier 900 using the pseudo resistor circuit 80 mainly differ from the pseudo resistor circuit 70 in the eighth embodiment and the charge amplifier 800 using the pseudo resistor circuit 70 in that a floating voltage source 7 is added. The remaining configurations of the pseudo resistor circuit 80 and the charge amplifier 900 are the same as those of the pseudo resistor circuit 70 and the charge amplifier 800. Accordingly, the description of the present embodiment focuses on the above difference. The same reference numerals are used in the ninth embodiment to identify the same components in the eighth embodiment and a description of such components is simplified or omitted herein.

[Configuration and Operation of Pseudo Resistor Circuit]

The configuration and an operation of the pseudo resistor circuit 80 in the present embodiment will be described in detail with reference to FIG. 17.

As illustrated in FIG. 17, the pseudo resistor circuit 80 in the present embodiment includes the floating voltage source 7 provided between the drain terminal D of the first field effect transistor Ma and the drain terminal D of the second field effect transistor Mb, in the pseudo resistor circuit 70 in the eighth embodiment. The configuration of the floating voltage source (the drain-side floating voltage source) 7 is the same as that of the floating voltage source 6 described above in the fifth embodiment, although the polarity of the floating voltage source 7 is opposite to that of the floating voltage source 6.

The voltage value Voff of the floating voltage source 7 is required to be set to a value higher than the amplitude maximum value Vmax of the drain voltage Vo of the first field effect transistor Ma (Voff>Vmax).

The provision of the floating voltage source 7 allows the drain voltage Vo of the first field effect transistor Ma to be converted into a negative value even when the drain voltage Vo of the first field effect transistor Ma does not have a supposed negative value but has a positive value. The voltage of the negative value is capable of being applied to the drain terminal D of the second field effect transistor Mb and the input-side terminal of the second operational amplifier OP2.

In addition, causing the floating voltage source 7 to output a voltage value proportional to the thermal voltage, as in the floating voltage source 6 in the fifth embodiment, allows the drain voltage of the first field effect transistor Ma to be adjusted. The pseudo resistance value of the first field effect transistor Ma is capable of being adjusted so as to offset the amount of variation caused by the variation in thermal voltage in the pseudo resistance value of the first field effect transistor Ma.

As a result, also in the pseudo resistor circuit 80 in the present embodiment, the pseudo resistance value of the first field effect transistor Ma is stably kept at the constant value. In addition, the provision of the floating voltage source 7 allows the pseudo resistance value of the first field effect transistor Ma to be adjusted so as to offset the amount of variation caused by the variation in thermal voltage concerning the drain voltage in the pseudo resistance value of the first field effect transistor Ma and to reduce the temperature dependence of the pseudo resistor circuit 80.

[Configuration and Operation of Charge Amplifier]

Next, the charge amplifier 900 to which the pseudo resistor circuit 80 having the above configuration is applied will be described in detail with reference to FIG. 18.

As illustrated in FIG. 18, the charge amplifier 900 in the present embodiment includes the third operational amplifier OP3 and the capacitor Cf, as in the charge amplifier 800 in the eighth embodiment, in addition to the pseudo resistor circuit 80.

In the pseudo resistor circuit 80 in the present embodiment, since the provision of the floating voltage source 7 allows the drain voltage Vo of the first field effect transistor Ma to be converted into a negative value even when the drain voltage Vo of the first field effect transistor Ma has a positive value, the pseudo resistance value of the first field effect transistor Ma is stably kept at the constant value, as in the pseudo resistor circuit 70 in the eighth embodiment. In addition, the provision of the floating voltage source 7 allows the pseudo resistance value of the first field effect transistor Ma to be adjusted so as to offset the amount of variation caused by the variation in thermal voltage concerning the drain voltage in the pseudo resistance value of the first field effect transistor Ma to reduce the temperature dependence of the pseudo resistor circuit 80.

Accordingly, in the charge amplifier 900 in the present embodiment, the output signal from the charge amplifier 900, which is output from the inverting input terminal (−) of the third operational amplifier OP3, is reliably amplified by the third operational amplifier OP3 and is output from the charge amplifier 900 in a mode in which the waveform distortion caused by the non-linearity of the pseudo resistance value is reduced in the detection signal in the lower-frequency domain, which is output from the charge output sensor, as in the charge amplifier 800 in the eighth embodiment.

Instead of the floating voltage source 7 in the present embodiment, a direct-current voltage source the voltage of which meets Voff>Vmax may be provided. In such a case, although the amount of variation caused by the variation in thermal voltage concerning the drain voltage in the pseudo resistance value of the first field effect transistor Ma is not offset, the drain voltage Vo of the first field effect transistor Ma is capable of being converted into a negative value even when the drain voltage Vo of the first field effect transistor Ma has a positive value. Accordingly, the voltage of the negative value is capable of being applied to the drain terminal D of the second field effect transistor Mb and the input-side terminal of the second operational amplifier OP2, as in the eighth embodiment.

Tenth Embodiment

Next, a pseudo resistor circuit in a tenth embodiment of the present invention and a charge amplifier using the pseudo resistor circuit will be described in detail with reference to FIG. 19 and FIG. 20.

Figure 19:
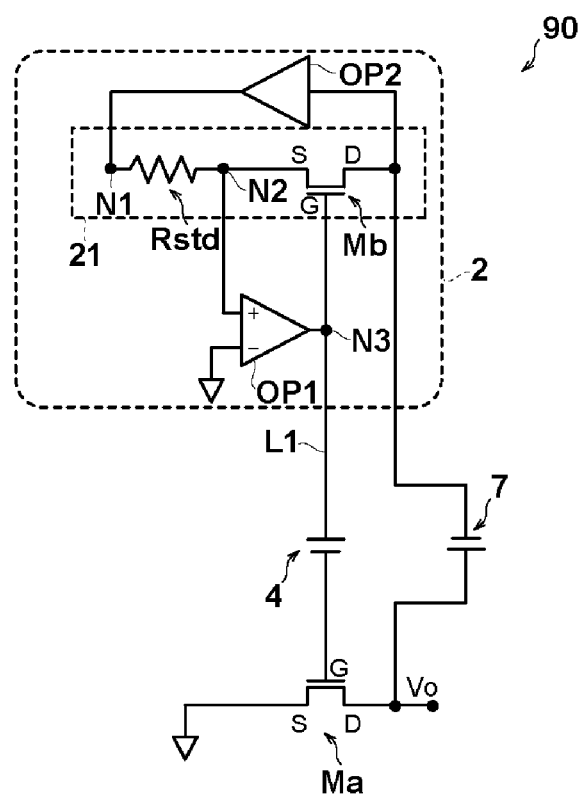
FIG. 19 is a circuit diagram illustrating a configuration of a pseudo resistor circuit in a tenth embodiment of the present invention.

FIG. 19 is a circuit diagram illustrating a configuration of the pseudo resistor circuit in the present embodiment. FIG. 20 is a circuit diagram illustrating a configuration of the charge amplifier to which the pseudo resistor circuit in the present embodiment is applied.

Figure 20:
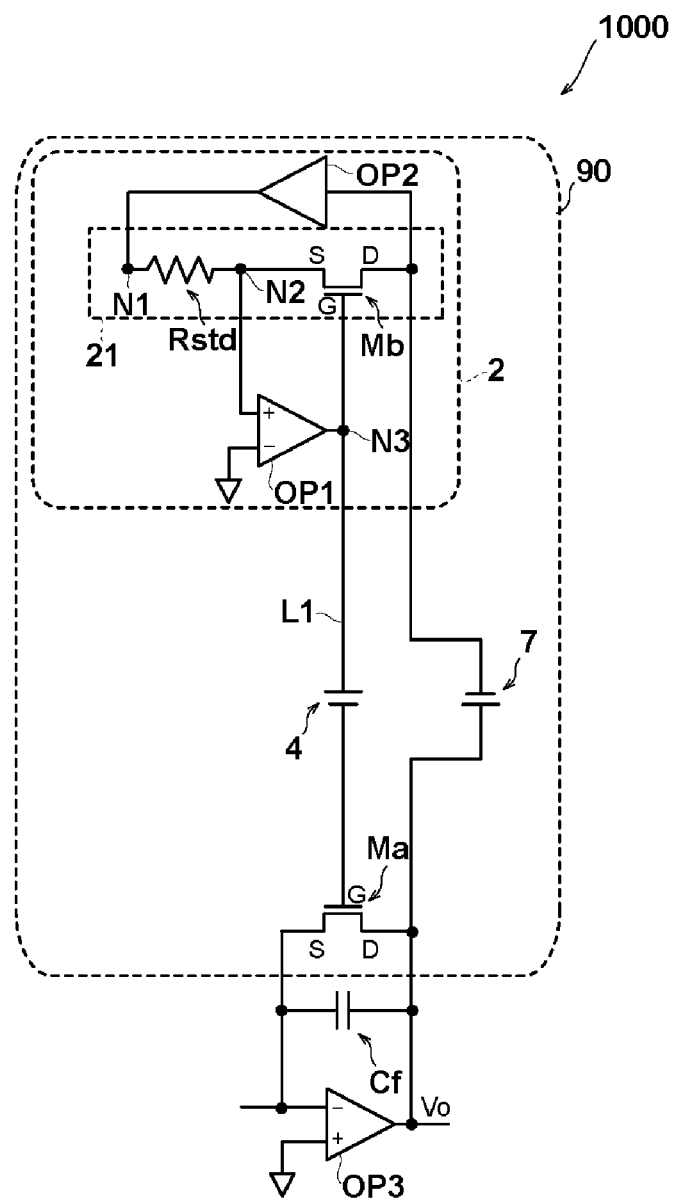
FIG. 20 is a circuit diagram illustrating a configuration of a charge amplifier to which the pseudo resistor circuit in the present embodiment is applied.

As illustrated in FIG. 19 and FIG. 20, a pseudo resistor circuit 90 in the present embodiment and a charge amplifier 1000 using the pseudo resistor circuit 90 mainly differ from the pseudo resistor circuit 80 in the ninth embodiment and the charge amplifier 900 using the pseudo resistor circuit 80 in that the direct-current voltage source 4 is added. The remaining configurations of the pseudo resistor circuit 90 and the charge amplifier 1000 are the same as those of the pseudo resistor circuit 80 and the charge amplifier 900. Accordingly, the description of the present embodiment focuses on the above difference. The same reference numerals are used in the tenth embodiment to identify the same components in the ninth embodiment and a description of such components is simplified or omitted herein.

[Configuration and Operation of Pseudo Resistor Circuit]

The configuration and operation of the pseudo resistor circuit 90 in the present embodiment will be described in detail with reference to FIG. 19.

As illustrated in FIG. 19, the pseudo resistor circuit 90 in the present embodiment further includes the direct-current voltage source 4 of certain voltage, which is provided on the electrical wiring L1 that electrically connects the gate terminal G of the first field effect transistor Ma to the gate terminal G of the second field effect transistor Mb, in the pseudo resistor circuit 80 in the ninth embodiment. The direct-current voltage source 4 is the same as that in the third embodiment.

In the pseudo resistor circuit 90 in the present embodiment, the provision of the direct-current voltage source 4 allows the gate voltage of the first field effect transistor Ma to be adjusted so as to be decreased using the voltage of the direct-current voltage source 4, as in the third embodiment. The pseudo resistance value of the first field effect transistor Ma is capable of being adjusted to a higher value.

As a result, in the pseudo resistor circuit 90 in the present embodiment, the pseudo resistance value of the first field effect transistor Ma is capable of being adjusted so as to offset the amount of variation caused by the variation in thermal voltage concerning the drain voltage in the pseudo resistance value of the first field effect transistor Ma and is stably kept at the constant value in which the temperature dependence is reduced, as in the pseudo resistor circuit 80 in the ninth embodiment. In addition, the pseudo resistance value of the first field effect transistor Ma is capable of being adjusted to a higher value.

[Configuration and Operation of Charge Amplifier]

Next, the charge amplifier 1000 to which the pseudo resistor circuit 90 having the above configuration is applied will be described in detail with reference to FIG. 20.

As illustrated in FIG. 20, the charge amplifier 1000 in the present embodiment includes the third operational amplifier OP3 and the capacitor Cf, as in the charge amplifier 900 in the ninth embodiment, in addition to the pseudo resistor circuit 90.

In the pseudo resistor circuit 90 in the present embodiment, the drain voltage Vo of the first field effect transistor Ma is converted into a negative value even when the drain voltage Vo of the first field effect transistor Ma has a positive value and the pseudo resistance value of the first field effect transistor Ma is capable of being adjusted so as to offset the amount of variation caused by the variation in thermal voltage concerning the drain voltage in the pseudo resistance value of the first field effect transistor Ma to reduce the temperature dependence of the pseudo resistor circuit 90, as in the pseudo resistor circuit 80 in the ninth embodiment. Accordingly, the waveform distortion caused by the non-linearity and the temperature dependence of the pseudo resistance value of the drain voltage Vo of the first field effect transistor Ma, that is, the output waveform output from the drain terminal D of the first field effect transistor Ma is reduced. In addition, the provision of the direct-current voltage source 4 allows the pseudo resistance value of the first field effect transistor Ma to be adjusted to a higher value.

Consequently, in the charge amplifier 1000 in the present embodiment, the waveform distortion caused by the non-linearity and the temperature dependence of the pseudo resistance value is reduced in the output signal from the charge amplifier 1000, which is output from the inverting input terminal (−) of the third operational amplifier OP3, as in the charge amplifier 900 in the ninth embodiment. In addition, the detection signal in the low-frequency domain, which is output from the charge output sensor, is also reliably amplified by the third operational amplifier OP3 and is output from the charge amplifier 1000, compared with the charge amplifier 900 in the ninth embodiment.

In the direct-current voltage source 4 in the present embodiment, the positive terminal of the direct-current voltage source 4 may be electrically connected to the gate terminal G of the first field effect transistor Ma and the negative terminal of the direct-current voltage source 4 may be electrically connected to the gate terminal G of the second field effect transistor Mb to allow the pseudo resistance value of the first field effect transistor Ma to be adjusted to a lower value, if needed.

The direct-current voltage source 4 in the present embodiment may be applied to the pseudo resistor circuit 70 in the eighth embodiment and the charge amplifier 800 using the pseudo resistor circuit 70.

Eleventh Embodiment

Next, a pseudo resistor circuit in an eleventh embodiment of the present invention and a charge amplifier using the pseudo resistor circuit will be described in detail with reference to FIG. 21 and FIG. 22.

Figure 21:
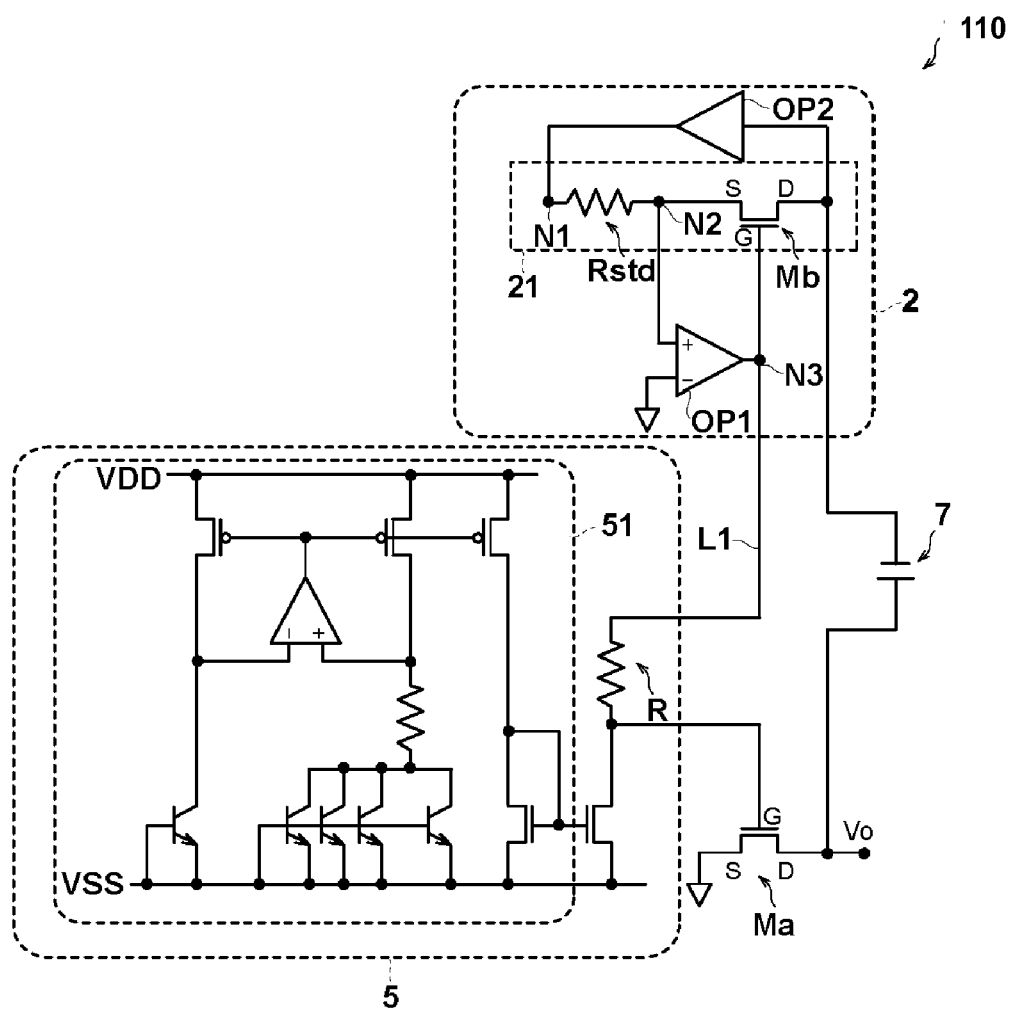
FIG. 21 is a circuit diagram illustrating a configuration of a pseudo resistor circuit in an eleventh embodiment of the present invention.

FIG. 21 is a circuit diagram illustrating a configuration of the pseudo resistor circuit in the present embodiment. FIG. 22 is a circuit diagram illustrating a configuration of the charge amplifier to which the pseudo resistor circuit in the present embodiment is applied.

Figure 22:
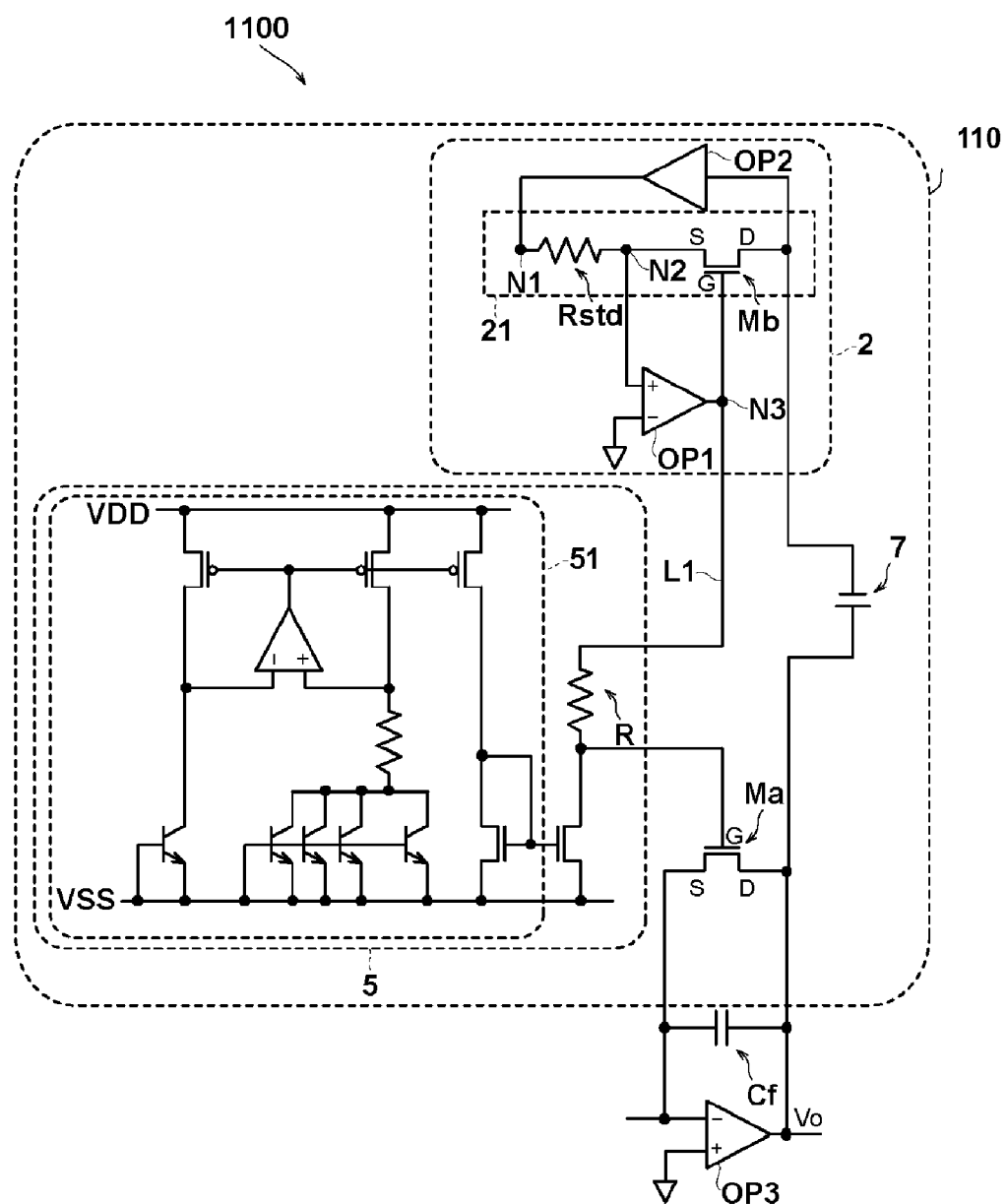
FIG. 22 is a circuit diagram illustrating a configuration of a charge amplifier to which the pseudo resistor circuit in the present embodiment is applied.

As illustrated in FIG. 21 and FIG. 22, a pseudo resistor circuit 110 in the present embodiment and a charge amplifier 1100 using the pseudo resistor circuit 110 mainly differ from the pseudo resistor circuit 90 in the tenth embodiment and the charge amplifier 1000 using the pseudo resistor circuit 90 in that the direct-current voltage source 4 is replaced with the floating voltage source 5. The remaining configurations of the pseudo resistor circuit 110 and the charge amplifier 1100 are the same as those of the pseudo resistor circuit 90 and the charge amplifier 1000. Accordingly, the description of the present embodiment focuses on the above difference. The same reference numerals are used in the eleventh embodiment to identify the same components in the tenth embodiment and a description of such components is simplified or omitted herein.

[Configuration and Operation of Pseudo Resistor Circuit]

The configuration and operation of the pseudo resistor circuit 110 in the present embodiment will be described in detail with reference to FIG. 21.

As illustrated in FIG. 21, the pseudo resistor circuit 110 in the present embodiment includes the floating voltage source 5 including the PTAT current source 51 and the resistor R, instead of the direct-current voltage source 4, in the pseudo resistor circuit 90 in the tenth embodiment. The configuration of the floating voltage source (the gate-side floating voltage source) 5 is the same as that in the fourth embodiment.

Specifically, in the pseudo resistor circuit 110 in the present embodiment, the provision of the floating voltage source 5 allows the gate voltage of the first field effect transistor Ma to be adjusted using the output voltage proportional to the temperature of the floating voltage source 5. The pseudo resistance value of the first field effect transistor Ma is capable of being adjusted so as to offset the amount of variation caused by the variation in thermal voltage in the pseudo resistance value of the first field effect transistor Ma.

As a result, in the pseudo resistor circuit 110 in the present embodiment, the pseudo resistance value of the first field effect transistor Ma is capable of being adjusted so as to offset the amount of variation caused by the variation in thermal voltage concerning the drain voltage in the pseudo resistance value of the first field effect transistor Ma, is stably kept at the constant value in which the temperature dependence is reduced, and is capable of being adjusted to a higher value, as in the pseudo resistor circuit 90 in the tenth embodiment. In addition, the provision of the floating voltage source 5 allows the pseudo resistance value of the first field effect transistor Ma to be adjusted so as to offset the amount of variation caused by the variation in thermal voltage concerning the gate voltage in the pseudo resistance value of the first field effect transistor Ma to reduce the temperature dependence of the pseudo resistor circuit 110.

[Configuration and Operation of Charge Amplifier]

Next, the charge amplifier 1100 to which the pseudo resistor circuit 110 having the above configuration is applied will be described in detail with reference to FIG. 22.

As illustrated in FIG. 22, the charge amplifier 1100 in the present embodiment includes the third operational amplifier OP3 and the capacitor Cf, as in the charge amplifier 1000 in the tenth embodiment, in addition to the pseudo resistor circuit 110.

In the pseudo resistor circuit 110 in the present embodiment, the pseudo resistance value of the first field effect transistor Ma is capable of being adjusted to a higher value, etc., as in the pseudo resistor circuit 90 in the tenth embodiment. In addition, the provision of the floating voltage source 5 allows the pseudo resistance value of the first field effect transistor Ma to be adjusted so as to offset the amount of variation caused by the variation in thermal voltage concerning the gate voltage in the pseudo resistance value of the first field effect transistor Ma to reduce the temperature dependence of the pseudo resistor circuit 110.

Accordingly, in the charge amplifier 1100 in the present embodiment, the output signal from the charge amplifier 1100 is output from the inverting input terminal (−) of the third operational amplifier OP3 in a mode in which the detection signal in the lower-frequency domain, which is output from the charge output sensor, is reliably amplified by the third operational amplifier OP3 and the waveform distortion caused by the non-linearity and the temperature dependence of the pseudo resistance value is reduced, as in the charge amplifier 1000 in the tenth embodiment. In addition, the temperature dependence of the charge amplifier 1100 is further reduced, compared with the charge amplifier 1000 in the tenth embodiment.

The floating voltage source 5 in the present embodiment may be applied to the pseudo resistor circuit 70 in the eighth embodiment and the charge amplifier 800 using the pseudo resistor circuit 70.

Although each of the first field effect transistor Ma and the second field effect transistor Mb is an n-type MOSFET in the above embodiments, each of the first field effect transistor Ma and the second field effect transistor Mb may be a p-type MOSFET because the configurations of the respective embodiments are applicable regardless of the type of the carrier of the MOSFET in principle. In such a case, the destinations of the electrical connection of the inverting input terminal and the non-inverting input terminal of the first operational amplifier OP1 are switched so as to establish the negative feedback using the first operational amplifier OP1.

Although each of the first field effect transistor Ma and the second field effect transistor Mb is a MOSFET in the above embodiments, each of the first field effect transistor Ma and the second field effect transistor Mb may be a field effect transistor other than the MOSFET if the field effect transistor has electrical characteristics corresponding to the electrical characteristics in the weak inversion region.

The present invention is not limited to the shapes, the arrangement, the number, and so on of the components in the above embodiments and the shapes, the arrangement, the number, and so on of the components may be appropriately varied within the spirit and scope of the invention. For example, the components may be appropriately replaced with components having the same effects and advantages.

INDUSTRIAL APPLICABILITY

As described above, according to the present invention, there are provided a pseudo resistor circuit that eliminates the necessity to provide an additional adjustment circuit for adjusting the pseudo resistance value of the field effect transistor depending on the variation in the manufacturing processes and the change in power supply voltage and temperature and that is capable of reducing the waveform distortion caused by the variation in the power supply voltage of the field effect transistor and a charge amplifier using the pseudo resistor circuit. Accordingly, the present invention is expected to be widely applicable to the fields of the pseudo resistor circuit, the charge amplifier, and so on owing to the general and universal features.

The invention claimed is:

1. A pseudo resistor circuit comprising:
   a first field effect transistor;
   a second field effect transistor having electrical characteristics matched with electrical characteristics of the first field effect transistor;
   a voltage dividing circuit including a reference resistor with a first terminal electrically connected to a source terminal of the second field effect transistor;
   a first operational amplifier including:
      an inverting input terminal, a non-inverting input terminal, and
      an output terminal electrically connected to respective gate terminals of the first and second field effect transistors,
      wherein one of the inverting and non-inverting input terminals is electrically connected to a node between a first terminal of the reference resistor and the source terminal of the second field effect transistor, and wherein the other of the inverting and non-inverting input terminals of the first operational amplifier is coupled to a reference voltage; and a second operational amplifier including an input terminal electrically connected to respective drain terminals of the first and second field effect transistors and an output terminal electrically coupled to a second terminal of the reference resistor.

2. The pseudo resistor circuit according to claim 1, wherein the second operational amplifier is configured to supply to the reference resistor a voltage resulting from inversion and amplification of drain voltage of the drain terminal of the first field effect transistor electrically connected to the drain terminal of the second field effect transistor.

3. The pseudo resistor circuit according to claim 1, further comprising an absolute value circuit configured to supply an absolute value voltage of the drain voltage of the first field effect transistor to the input terminal of the second operational amplifier and the drain terminal of the second field effect transistor.

4. The pseudo resistor circuit according to claim 1, further comprising a first voltage source coupled between the gate terminal of the second field effect transistor and the gate terminal of the first field effect transistor.

5. The pseudo resistor circuit according to claim 4, wherein the first voltage source is a direct-current voltage with a negative terminal of electrically connected to the gate terminal of the first field effect transistor and a positive terminal electrically connected to the gate terminal of the second field effect transistor.

6. The pseudo resistor circuit according to claim 4, wherein the first voltage source is a floating voltage source including a proportional to absolute temperature current source and a resistor.

7. The pseudo resistor circuit according to claim 4, further comprising a second voltage source coupled between the gate terminal of the first field effect transistor and the gate terminal of the second field effect transistor.

8. The pseudo resistor circuit according to claim 7, wherein the second voltage source is a floating voltage source including a proportional to absolute temperature current source and a resistor.

9. The pseudo resistor circuit according to claim 1, further comprising a first voltage source coupled between the drain terminal of the second field effect transistor and the drain terminal of the first field effect transistor.

10. The pseudo resistor circuit according to claim 9, wherein the first voltage source is a direct-current voltage with a negative terminal of electrically connected to the drain terminal of the first field effect transistor and a positive terminal electrically connected to the drain terminal of the second field effect transistor.

11. The pseudo resistor circuit according to claim 9, wherein the first voltage source is a floating voltage source including a proportional to absolute temperature current source and a resistor.

12. The pseudo resistor circuit according to claim 1, wherein the non-inverting input terminal of the first operational amplifier is coupled to the reference voltage and the inverting input terminal of the first operational amplifier is coupled to node between the second terminal of the reference resistor and the source terminal of the second field effect transistor.

13. The pseudo resistor circuit according to claim 1, wherein the inverting input terminal of the first operational amplifier is coupled to the reference voltage and the non-inverting input terminal of the first operational amplifier is coupled to node between the second terminal of the reference resistor and the source terminal of the second field effect transistor.

14. A charge amplifier comprising:
a pseudo resistor circuit including:
a first field effect transistor;
a second field effect transistor having electrical characteristics matched with electrical characteristics of the first field effect transistor;
a voltage dividing circuit including a reference resistor with a first terminal electrically connected to a source terminal of the second field effect transistor;
a first operational amplifier including: an inverting input terminal, a non-inverting input terminal, and an output terminal electrically connected to respective gate terminals of the first and second field effect transistors,
wherein one of the inverting and non-inverting input terminals is electrically connected to a node between a first terminal of the reference resistor and the source terminal of the second field effect transistor, and
wherein the other of the inverting and non-inverting input terminals of the first operational amplifier is coupled to a reference voltage; and
a second operational amplifier including an input terminal electrically connected to respective drain terminals of the first and second field effect transistors and an output terminal electrically coupled to a second terminal of the reference resistor; and
a third operational amplifier including an inverting input terminal electrically connected to a source terminal of the first field effect transistor, a non-inverting input terminal electrically coupled to the reference voltage, and an output terminal electrically connected to the drain terminal of the first field effect transistor.

15. The charge amplifier according to claim 14, further comprising a capacitor electrically connected between the inverting input terminal of the third operational amplifier and the output terminal of the third operational amplifier and between the source terminal of the first field effect transistor and the drain terminal of the first field effect transistor.

16. The charge amplifier according to claim 14, wherein the second operational amplifier is configured to supply to the reference resistor a voltage resulting from inversion and amplification of drain voltage of the drain terminal of the first field effect transistor electrically connected to the drain terminal of the second field effect transistor.

17. The charge amplifier according to claim 14, wherein the pseudo resistor circuit further comprises an absolute value circuit configured to supply an absolute value voltage of the drain voltage of the first field effect transistor to the input terminal of the second operational amplifier and the drain terminal of the second field effect transistor.

18. The charge amplifier according to claim 14, wherein the pseudo resistor circuit further comprises a first voltage source coupled between the gate terminal of the second field effect transistor and the gate terminal of the first field effect transistor.

19. The charge amplifier according to claim 18, wherein the first voltage source is a floating voltage source including a proportional to absolute temperature current source and a resistor.

20. The charge amplifier according to claim 19, wherein the pseudo resistor circuit further comprises a second voltage source coupled between the gate terminal of the first field effect transistor and the gate terminal of the second field effect transistor.

* * * * *